United States Patent
Ishida et al.

(10) Patent No.: US 11,121,262 B2
(45) Date of Patent: Sep. 14, 2021

(54) SEMICONDUCTOR DEVICE INCLUDING THIN FILM TRANSISTOR AND METHOD FOR MANUFACTURING THE SAME

(71) Applicant: SAKAI DISPLAY PRODUCTS CORPORATION, Sakai (JP)

(72) Inventors: Shigeru Ishida, Sakai (JP); Tomohiro Inoue, Sakai (JP); Ryohei Takakura, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 31 days.

(21) Appl. No.: 16/616,470

(22) PCT Filed: Jul. 12, 2017

(86) PCT No.: PCT/JP2017/025435
§ 371 (c)(1),
(2) Date: Nov. 24, 2019

(87) PCT Pub. No.: WO2019/012631
PCT Pub. Date: Jan. 17, 2019

(65) Prior Publication Data
US 2020/0227567 A1 Jul. 16, 2020

(51) Int. Cl.
*H01L 29/04* (2006.01)
*H01L 29/786* (2006.01)
(Continued)

(52) U.S. Cl.
CPC .... *H01L 29/78696* (2013.01); *H01L 27/1222* (2013.01); *H01L 29/66765* (2013.01); *H01L 29/78618* (2013.01)

(58) Field of Classification Search
CPC ......... H01L 29/78696; H01L 29/78678; H01L 29/66765; H01L 29/78618; H01L 29/78669
See application file for complete search history.

(56) References Cited

U.S. PATENT DOCUMENTS

2003/0022471 A1 1/2003 Taketomi et al.
2010/0117074 A1* 5/2010 Yamazaki ......... H01L 29/78678
257/43

(Continued)

FOREIGN PATENT DOCUMENTS

JP 2000-068520 A 3/2000
JP 2000-196098 A 7/2000
(Continued)

*Primary Examiner* — Phuc T Dang
(74) *Attorney, Agent, or Firm* — ScienBiziP, P.C.

(57) ABSTRACT

A semiconductor device includes a thin film transistor including: a substrate 1; a gate electrode 2 supported on the substrate 1; a semiconductor layer 4 provided on the gate electrode with a gate insulating layer 3 therebetween, wherein the semiconductor layer includes a first region Rs, a second region Rd, and a source-drain interval region SG that is located between the first region and the second region and overlaps with the gate electrode as seen from a direction normal to the substrate; a first contact layer Cs in contact with the first region and a second contact layer Cd in contact with the second region; a source electrode 8s electrically connected to the first region with the first contact layer therebetween; and a drain electrode 8d electrically connected to the second region with the second contact layer therebetween, wherein: the semiconductor layer includes a crystalline silicon region 4c, and at least a portion of the crystalline silicon region is located in the source-drain interval region SG; and the semiconductor layer has at least one opening P that is located in the source-drain interval region SG and reaches the gate insulating layer.

19 Claims, 11 Drawing Sheets

(51) Int. Cl.
  *H01L 27/12* (2006.01)
  *H01L 29/66* (2006.01)

(56) References Cited

U.S. PATENT DOCUMENTS

| | | |
|---|---|---|
| 2012/0220140 A1 | 8/2012 | Kajiyama et al. |
| 2013/0048996 A1* | 2/2013 | Noda ................. H01L 27/1225 257/59 |
| 2017/0154901 A1 | 6/2017 | Nodera et al. |
| 2018/0097120 A1 | 4/2018 | Ishida et al. |
| 2018/0122839 A1 | 5/2018 | Nodera et al. |
| 2018/0197901 A1* | 7/2018 | Sun ................. H01L 21/02592 |

FOREIGN PATENT DOCUMENTS

| | | |
|---|---|---|
| JP | 2010-225780 A | 10/2010 |
| JP | 2010-225781 A | 10/2010 |
| WO | 2011/055618 A1 | 5/2011 |
| WO | 2011/132559 A1 | 10/2011 |
| WO | 2016/157313 A1 | 10/2016 |
| WO | 2016/157351 A1 | 10/2016 |
| WO | 2016/170571 A1 | 10/2016 |

* cited by examiner

FIG.1
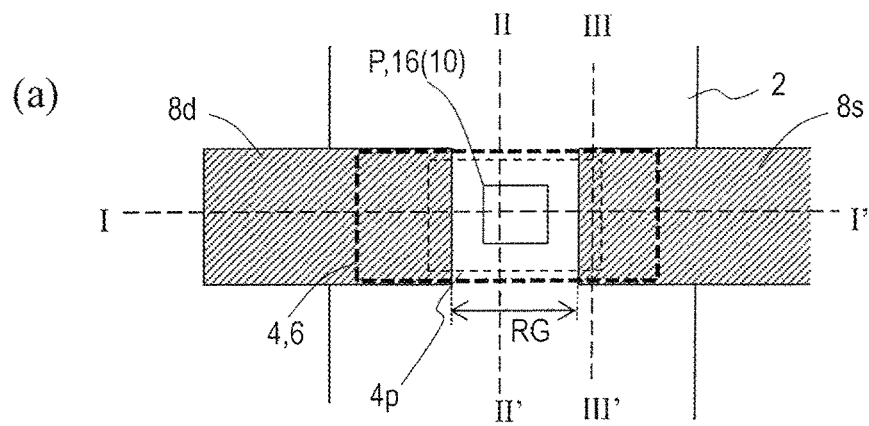
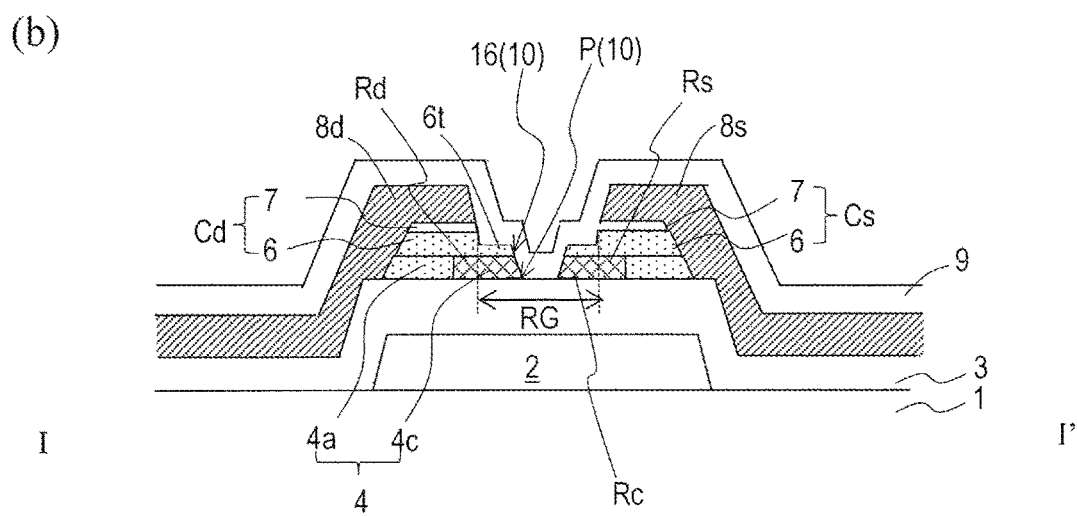
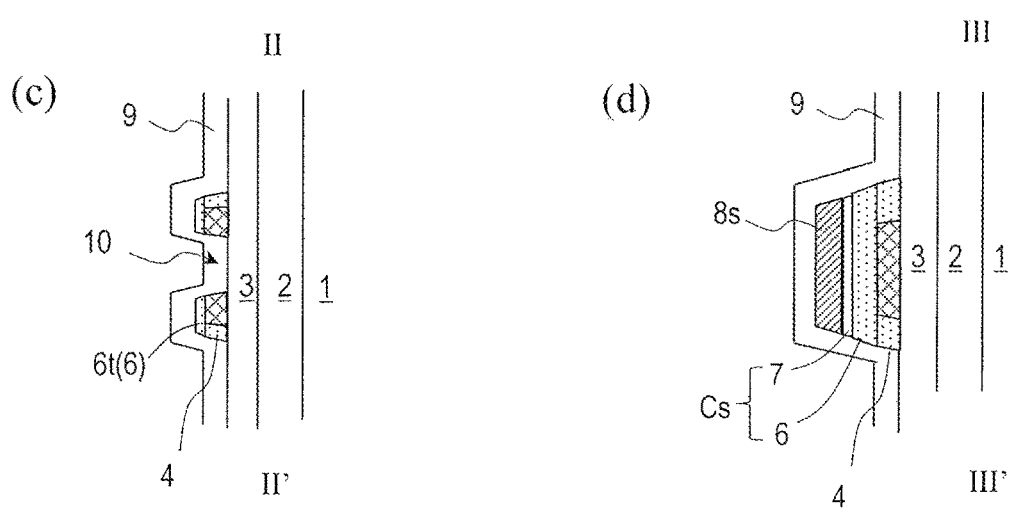

FIG.2
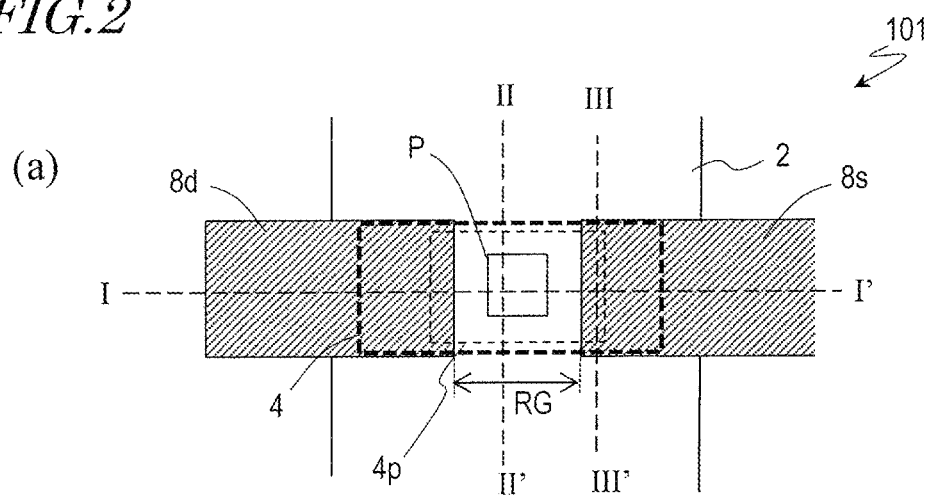
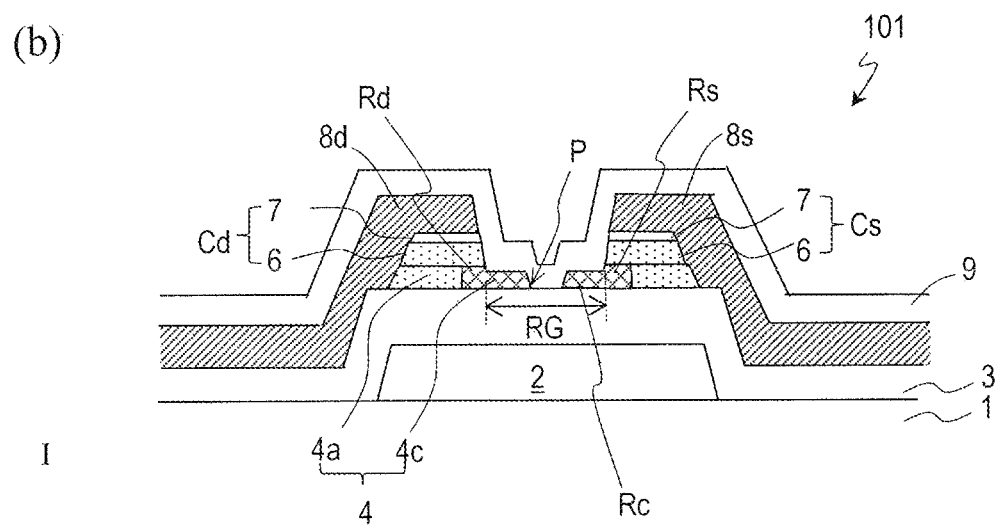
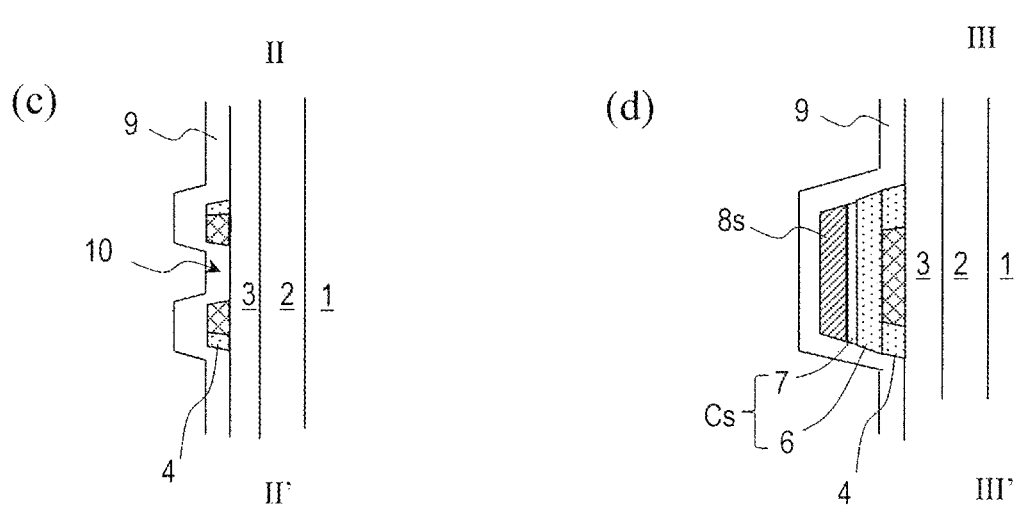

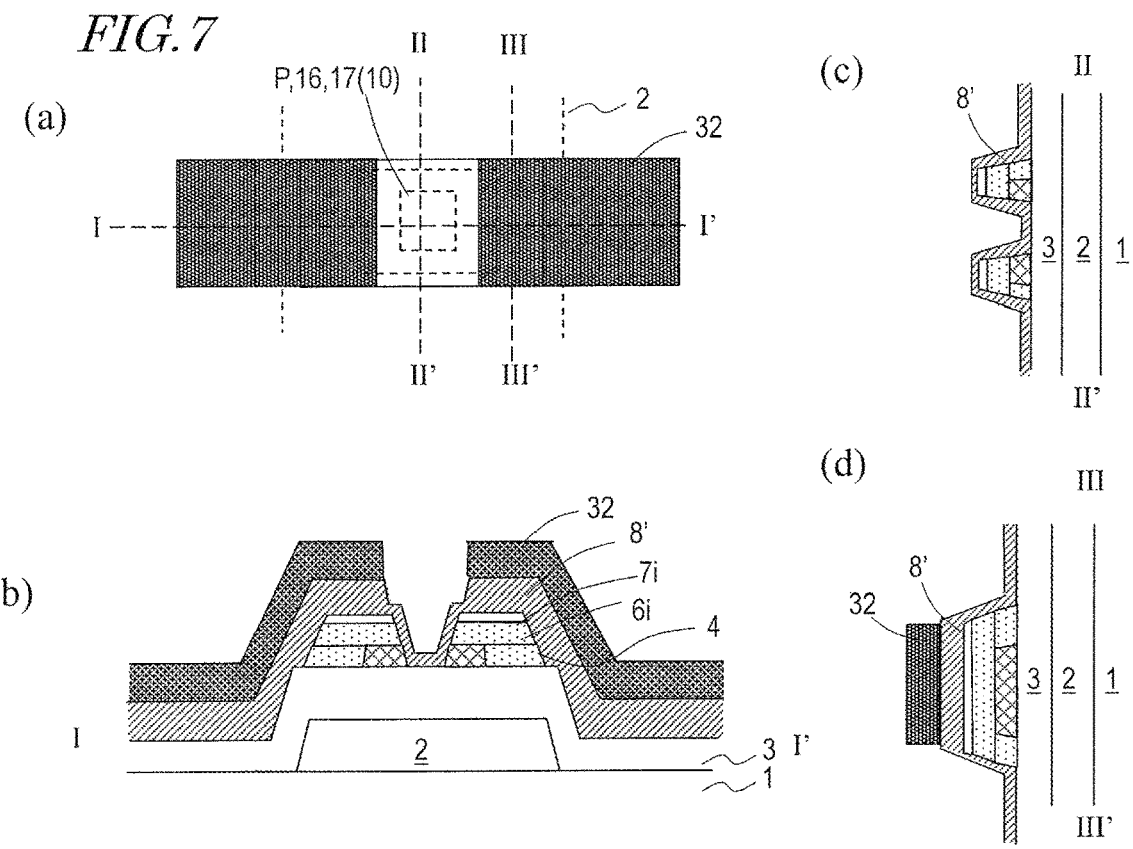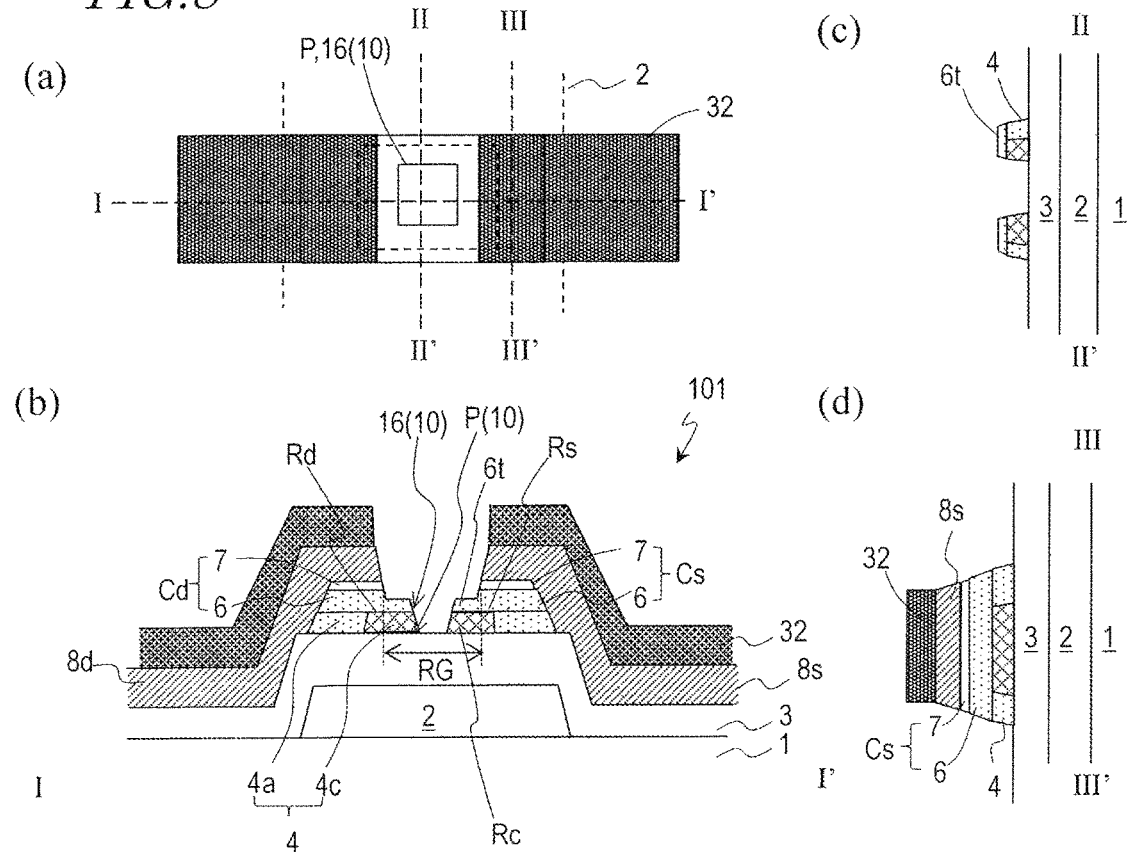

FIG.12
(a)
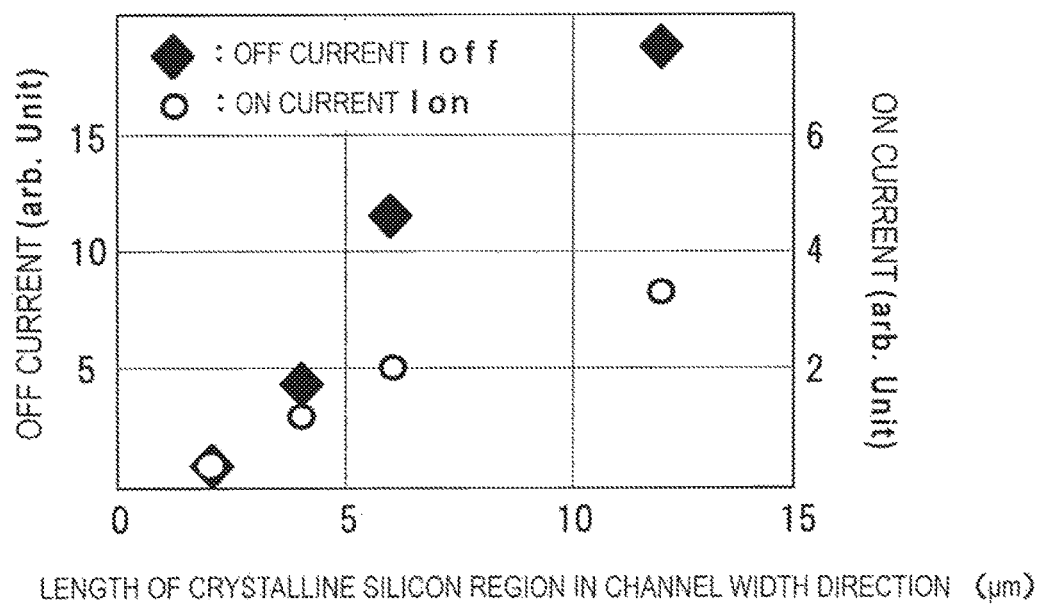
(b)
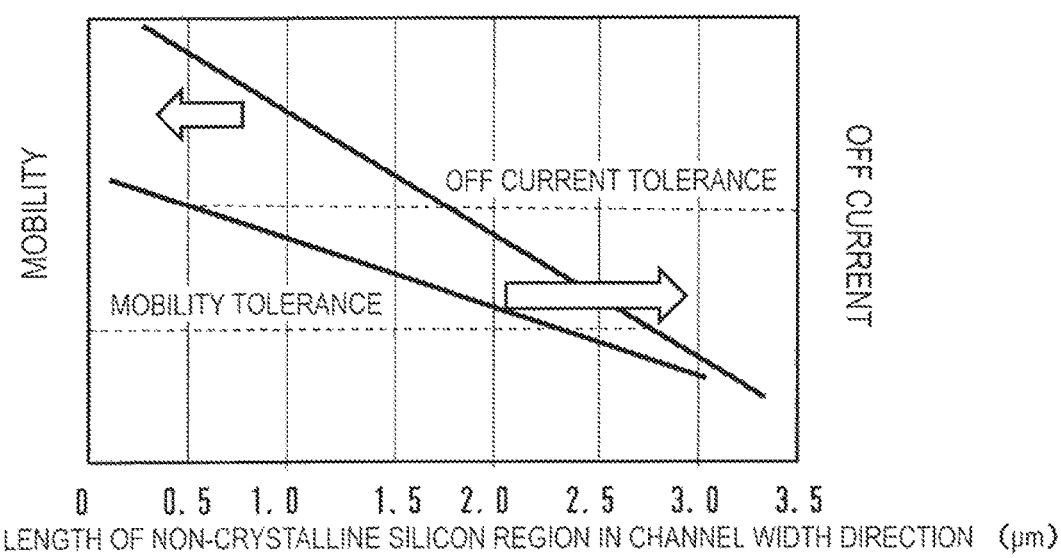

SEMICONDUCTOR DEVICE INCLUDING THIN FILM TRANSISTOR AND METHOD FOR MANUFACTURING THE SAME

TECHNICAL FIELD

The present invention relates to a semiconductor device including a thin film transistor, and a method for manufacturing the same.

BACKGROUND ART

Thin film transistors (hereinafter, "TFTs") are used as switching elements in an active matrix substrate, for example. In the present specification, such TFTs are called "pixel TFTs". Conventionally, non-crystalline silicon TFTs using an amorphous silicon film (hereinafter, abbreviated as "a-Si film") as the active layer, crystalline silicon TFTs using a crystalline silicon film (hereinafter, abbreviated as "c-Si film") such as a polycrystalline silicon film as the active layer, and the like, are used as pixel TFTs. Typically, the electric field mobility of a c-Si film is higher than the electric field mobility of an a-Si film, and a crystalline silicon TFT therefore has a higher current driving force (i.e., a larger ON current) than a non-crystalline silicon TFT.

With an active matrix substrate used in a display device, or the like, the c-Si film to be the active layer of the crystalline silicon TFT is formed by forming an a-Si film on a glass substrate and then crystallizing the a-Si film through laser light irradiation (laser annealing).

As a crystallization method using laser annealing, methods have been proposed in the art in which a microlens array is used to converge laser light onto only a region of the a-Si film that is to be the active layer of the TFT, thereby partially crystallizing the a-Si film (Patent Document Nos. 1 to 3). In the present specification, the crystallization method is referred to as "partial laser annealing". Using partial laser annealing, as compared with conventional laser annealing in which the entire surface of the a-Si film is scanned with linear laser light, it is possible to significantly shorten the amount of time required crystallization and to thereby improve the mass-productivity.

Note that if the active layer of the TFT is formed by using partial laser annealing, the active layer may have a non-crystalline silicon region where it is not irradiated with laser light and remains non-crystalline, as well as a crystalline silicon region where it is irradiated with laser light to be crystallized. The active layer of a "crystalline silicon TFT" as used in the present specification may only be composed of crystalline silicon regions, or may include both crystalline silicon regions and non-crystalline silicon regions.

CITATION LIST

Patent Literature

Patent Document No. 1: International Publication WO2011/132559
Patent Document No. 2: International Publication WO2016/157351
Patent Document No. 3: International Publication WO2016/170571

SUMMARY OF INVENTION

Technical Problem

With a crystalline silicon TFT, as compared with a non-crystalline silicon TFT, the ON current increases but the OFF leak current also increases. Therefore, depending on the application of the crystalline silicon TFT, there is a demand for reducing the OFF leak current.

An object of one embodiment of the present invention, which has been made in view of the above, is to provide semiconductor device including thin film transistors having a reduced OFF leak current and a method for manufacturing such a semiconductor device.

Solution to Problem

A semiconductor device according to one embodiment of the present invention is a semiconductor device including a thin film transistor, wherein: the thin film transistor includes: a substrate; a gate electrode supported on the substrate; a semiconductor layer provided on the gate electrode with a gate insulating layer therebetween, wherein the semiconductor layer includes a first region, a second region, and a source-drain interval region that is located between the first region and the second region and overlaps with the gate electrode as seen from a direction normal to the substrate, the source-drain interval region including a channel region; first contact layer in contact with the first region and a second contact layer in contact with the second region; a source electrode electrically connected to the first region with the first contact layer therebetween; and a drain electrode electrically connected to the second region with the second contact layer therebetween; the semiconductor layer includes a crystalline silicon region, and at least a portion of the crystalline silicon region is located in the source-drain interval region; and the semiconductor layer has at least one opening that is located in the source-drain interval region and reaches the gate insulating layer.

Advantageous Effects of Invention

According to one embodiment of the present invention, there is provided a semiconductor device including thin film transistors having a reduced OFF leak current and a method for manufacturing such a semiconductor device.

BRIEF DESCRIPTION OF DRAWINGS

FIGS. 1(a) to 1(d) are a schematic plan view and schematic cross-sectional views of a TFT 101 according to one embodiment of the present invention.

FIGS. 2(a) to 2(d) are a schematic plan view and schematic cross-sectional views of another TFT according to one embodiment of the present invention.

FIGS. 7(a) to 7(d) are a schematic step-by-step plan view and schematic step-by-step cross-sectional views illustrating an example of a method for manufacturing a semiconductor device according to one embodiment of the present invention.

FIGS. 8(a) to 8(d) are a schematic step-by-step plan view and schematic step-by-step cross-sectional views illustrating an example of a method for manufacturing a semiconductor device according to one embodiment of the present invention.

FIG. 12(a) is a graph showing the relationship between the length of the c-Si region in the channel width direction and the current characteristics of the TFT, and FIG. 12(b) is a graph showing the relationship between the length of the a-Si region in the channel width direction and the OFF current and the mobility of the TFT.

DESCRIPTION OF EMBODIMENTS

Embodiments

Figure 3:
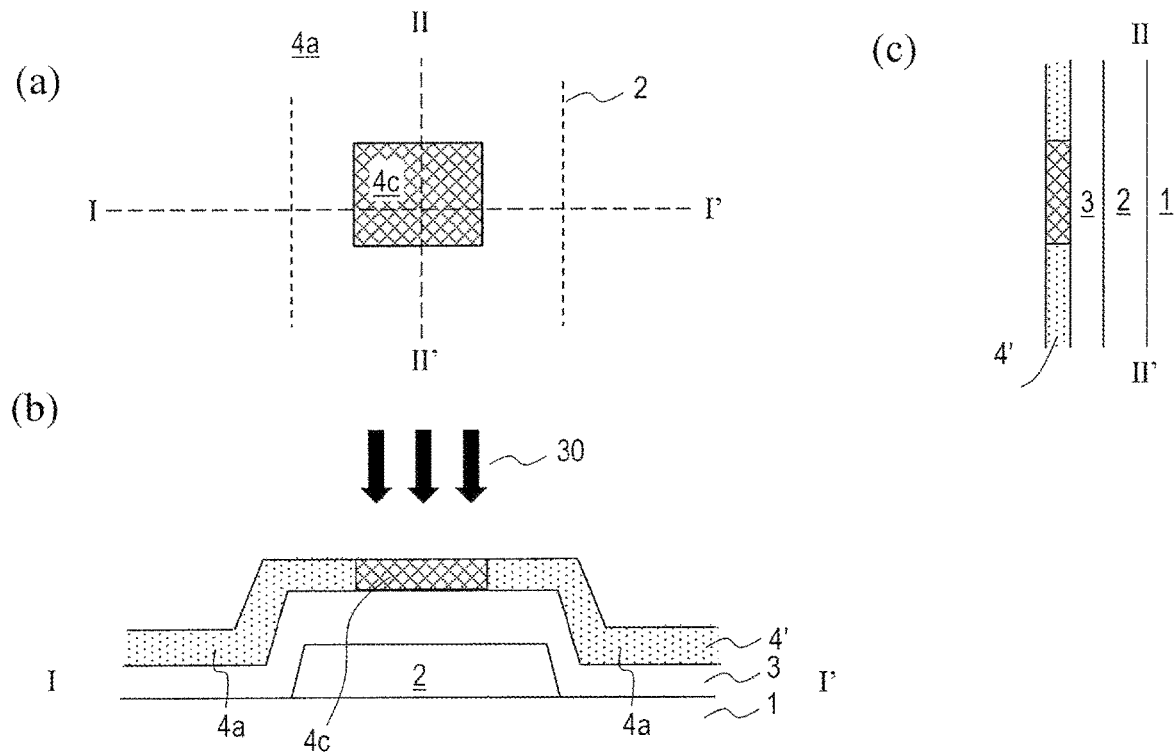
FIGS. 3(a) to 3(c) are a schematic step-by-step plan view and schematic step-by-step cross-sectional views illustrating an example of a method for manufacturing a semiconductor device according to one embodiment of the present invention.

A semiconductor device according to one embodiment of the present invention will now be described with reference to the drawings. The semiconductor device of the present embodiment may be any device that includes a crystalline silicon TFT having an active layer including a c-Si region, and generally includes circuit substrates such as active matrix substrates, various display devices such as liquid crystal display devices and organic EL display devices, image sensors, electronic appliances, etc.

FIG. 1(a) is a schematic plan view of a thin film transistor (TFT) 101 in a semiconductor device of the present embodiment, and FIGS. 1(b) to 1(d) are cross-sectional views of the TFT 101 taken along line I-I', line II-II' and line III-III', respectively.

The TFT 101 is a channel-etched-type TFT having a bottom gate structure, for example. The TFT 101 is supported on a substrate 1 such as a glass substrate, and includes: a gate electrode 2 formed on the substrate 1; a gate insulating layer 3 formed on the substrate 1 so as to cover the gate electrode 2; a semiconductor layer (active layer) 4 formed on the gate insulating layer 3; a first contact layer Cs and a second contact layer Cd arranged on the semiconductor layer 4; and a source electrode 8s and a drain electrode 8d. The source electrode 8s is electrically connected to a portion of the semiconductor layer 4 with the first contact layer Cs therebetween. The drain electrode 8d is electrically connected to another portion of the semiconductor layer 4 with the second contact layer Cd therebetween.

The semiconductor layer 4 is a layer that functions as the active layer of the TFT 101, and includes a crystalline silicon region (c-Si region) 4c. The c-Si region 4c is a region that primarily includes crystalline silicon (including polycrystalline silicon, microcrystalline silicon and monocrystalline silicon). At least a portion of the c-Si region 4c is arranged so as to overlap with the gate electrode 2 with the gate insulating layer therebetween.

The semiconductor layer 4 may include the c-Si region 4c, and the non-crystalline silicon region (a-Si region) 4a that primarily includes a-Si. Alternatively, the entire semiconductor layer 4 may be the c-Si region 4c. The semiconductor layer 4 is an intrinsic silicon layer, for example. Note that "intrinsic silicon layer" in the present specification refers to a silicon layer that does not substantially include an impurity, i.e., not actively doped with an impurity.

Also, the semiconductor layer 4 includes a first region Rs in contact with the first contact layer Cs, a second region Rd in contact with the second contact layer Cd, and a region located between the first region Rs and the second region Rd (hereinafter referred to as the "source-drain interval region") RG. The first region Rs is electrically connected to the source electrode 8s with the first contact layer Cs therebetween. The second region Rd is electrically connected to the drain electrode 8d with the second contact layer Cd therebetween. The source-drain interval region RG is a portion of the semiconductor layer 4 that overlaps with the gate electrode 2 with the gate insulating layer 3 therebetween and is located between the first region Rs and the second region Rd. An opening P that reaches the gate insulating layer 3 is provided in the source-drain interval region RG of the semiconductor layer 4. A portion of the source-drain interval region RG where the opening P is absent is the "channel region Rc" where the channel of the TFT 101 is formed.

In the semiconductor layer 4, at least a portion of the c-Si region 4c is located in the source-drain interval region RG. In this example, the source-drain interval region RG includes the c-Si region 4c and does not include the a-Si region 4a. Note that the source-drain interval region RG may include both of the c-Si region 4c and the a-Si region 4a (see FIGS. 14 and 15 to be described below).

It is preferred that the first region Rs and the second region Rd of the semiconductor layer 4 each include the c-Si region 4c. The first region Rs and the second region Rd may each be composed only of the c-Si region 4c or may include both of the c-Si region 4c and the a-Si region 4a.

While there is no particular limitation on the first contact layer C and the second contact layer Cd, they may include a silicon layer that includes a conductivity type determining impurity (which may be either an a-Si layer or a c-Si layer), for example. In this example, the first contact layer Cs and the second contact layer Cd each include a first a-Si layer 6 in contact with the semiconductor layer 4 and a second a-Si layer 7 arranged on the first a-Si layer 6. The second a-Si layer 7 has higher conductivity than the first a-Si layer 6. The second a-Si layer 7 may include a conductivity type determining impurity. The first a-Si layer 6 may be an intrinsic silicon layer that does not substantially include an impurity, for example, and the second a-Si layer 7 may be an n+-type a-Si layer doped with an n-type giving impurity. Where the first a-Si layer 6 includes an impurity, the second a-Si layer 7 may include a conductivity type determining impurity at a higher concentration than the first a-Si layer 6. Note that the first contact layer Cs and the second contact layer Cd may have a single-layer structure of the second a-Si layer (e.g., an n+-type a-Si layer) 7. Note however that it is possible to suppress deterioration of the TFT characteristic due to hot carriers by providing the first a-Si layer 6 between the c-Si region 4c of the semiconductor layer 4 and the second a-Si layer 7.

Where the first contact layer Cs and the second contact layer Cd have a layered structure, it is preferred that at least the uppermost layers or the layers with the highest conductivity are arranged spaced apart from each other. For example, as illustrated in FIG. 1, the second a-Si layers 7, which are the upper layers of the first contact layer Cs and the second contact layer Cd, may be arranged spaced apart from each other, and the first a-Si layers 6, which are the lower layers, do not need to be separated from each other.

In this example, the second layer 7 is divided into a portion that is located on the first region Rs and forms the first contact layer Cs, and a portion that is located on the second region R and forms the second contact layer Cd. The second a-Si layer 7 is not arranged on the channel region Rc. As seen from the direction normal to the substrate 1, portions (edge portions on the channel region Rc side) of the periphery of the second a-Si layer 7 may be aligned respectively with the edge portions of the source electrode 8s and the drain electrode 8d, and other portions (edge portions on the side opposite to the channel region Rc) may be aligned respectively with the edge portions of the semiconductor layer 4.

On the other hand, the first a-Si layer 6 is in contact with the upper surfaces of the channel region Rc, the first region Rs and the second region Rd of the semiconductor layer 4. A portion of the first a-Si layer 6 that is in contact with the first region Rs and forms the first contact layer Cs and a portion of the first a-Si layer 6 that is in contact with the second region Rd and forms the second contact Cd are connected together by a portion 6t in contact with the channel region Rc. The portion (i.e., the portion that is located in the source drain interval region RG and is not covered by the second a-Si film) 6t in contact with the channel region Rc is thinner than portions in contact with the first region Rs and the second region Rd.

The portion (thinned portion) 6t of the first a-Si layer 6 that is in contact with the channel region Rc has a first opening 16 at a position corresponding to the opening P of the semiconductor layer 4. The opening P of the semiconductor layer 4 and the first opening 16 of the first a-Si layer 6 together form the opening 10 that reaches the gate insulating layer 3. As seen from the direction normal to the substrate 1, the periphery of the first a-Si layer 6 may be aligned with the periphery of the semiconductor layer 4. On the side wall of the opening 10, the side surface of the opening P of the semiconductor layer 4 and the side surface of the first opening 16 of the first a-Si layer 6 may be aligned with each other.

Alternatively, the first contact layer Cs and the second contact layer Cd may be arranged spaced apart from each other. For example, as shown in FIG. 2, the first a-Si layers 6 and the second a-Si layers 7 of the first contact layer Cs and the second contact layer Cd may be arranged spaced apart from each other. In this example, the first contact layer Cs is arranged in an island-like pattern on the first region Rs, and the second contact layer Cd is arranged in an island-like pattern on the second region Rd. As seen from the direction normal to the substrate 1, portions (edge portions on the channel region Rc side) of the periphery of the first contact layer Cs and the second contact layer Cd may be aligned respectively with the edge portions of the source electrode 8s and the drain electrode 8d, and other portions (edge portions on the side opposite to the channel region Rc) may be aligned respectively with the edge portions of the semiconductor layer 4.

The TFT 101 may be covered by an inorganic insulating layer (passivation film) 9, for example. The inorganic insulating layer 9 may be in contact with the gate insulating layer 3 in the opening P. Between the source electrode 8s and the drain electrode 8d, the inorganic insulating layer 9 may be in contact with the upper surface of the thinned portion 6t of the first a-Si layer 6 as shown in FIG. 1(b), or may be in contact with the upper surface of the channel region Rc of the semiconductor layer 4 as shown in FIG. 2(b). An organic insulating layer (not shown) may be further provided on the inorganic insulating layer 9. The organic insulating layer may be a flattening film.

With the TFT 101, in the ON state, a current flow from one electrode, of the source electrode 8s and the drain electrode 8d, to the other electrode. For example, where a current flows in the direction from the source electrode 8s to the drain electrode 8d, the current flows from the source electrode 8s, passes through the first contact layer Cs, flows through the channel region Rc of the semiconductor layer 4, and then passes through the second contact layer Cd to reach the drain electrode 8d.

In the present embodiment, opening P is provided on the path of the current flowing between the source electrode 8s and the drain electrode 8d in the source-drain interval region RG, thereby inhibiting the current flow. Thus, it is possible to reduce the OFF leak current.

With the provision of the opening P, not only the OFF leak current but also the ON current decreases. However, in the present embodiment, since high mobility c-Si region 4c is used in the channel region Rc, it is possible to ensure a predetermined ON characteristic even if the ON current somewhat lowers due to the formation of the opening P. Moreover, since the current inhibiting effect of the opening P is more pronounced for the OFF current than for the ON current, it is possible to decrease the OFF current while ensuring the ON characteristic by controlling the size, position, etc., of the opening P.

As will be described below, by forming the contact layers Cs and Cd by simultaneously etching the contact layers Cs and Cd with the semiconductor layer 4 and then simultaneously etching the contact layers Cs and Cd with the source and drain electrodes 8s and 8d, for example, it is possible to manufacture the TFT 101 having a reduced OFF leak current while suppressing an increase in the number of manufacturing steps.

Note that one may consider reducing the OFF leak current by decreasing the width of the active layer (the channel width) of the TFT without providing an opening in the active layer of the TFT, for example. However, where the TFT is manufactured by using a photolithography process (including resist formation, exposure, development, etching using the resist as a mask and resist peeling), the width of the active layer may not be sufficiently miniaturized depending on the process precision. As an example, where the process precision of the photolithography process is 6 µm, it is difficult to form an active layer (silicon layer) having a width of 5 µm. On the other hand, it is possible to form, with a high precision, an opening having a width of 15 µm in the active layer having a width of 20 µm, and it is therefore possible to obtain the active layer having an effective channel width (effective channel width) of 5 µm. Therefore, according to the present embodiment, with the provision of the opening P, it is possible to form, with a higher precision, a TFT whose effective channel width is small or whose effective area of the channel region (effective channel area) is small.

The position, shape, etc., of the opening P provided in the semiconductor layer 4 are not limited to those of the illustrated example. As will be described below, two or more openings P may be arranged in the source-drain interval region RG.

The opening P may be arranged inside the c-Si region 4c and surrounded by the c-Si region 4c. That is, a portion of the semiconductor layer 4 that is exposed on the side surface of the opening 10 may be crystalline silicon. Alternatively, the opening P may be formed so as to bridge between the c-Si region 4c and the a-Si region 4a. For example, as seen from the direction normal to the substrate 1, in the source-drain interval region RG, the opening P may be arranged on a portion of the interface between the c-Si region 4c and the a-Si region 4a. Or, the opening P may be arranged inside the a-Si region 4a and surrounded by the a-Si region 4a. Note however that as long as at least a portion of the opening P is formed in the c-Si region 4c, it is possible to more effectively reduce the OFF leak current.

According to the present embodiment, it is possible to arbitrarily select not only the position, size and shape of the opening P, but also the positional relationship between the opening P and the c-Si region 4c and the a-Si region 4a, and it is therefore possible to obtain TFTs having desired characteristics depending on the application. For example, where a plurality of TFTs for different applications are formed on the substrate 1, it is possible to change the positional relationship between openings and the c-Si region 4c and the a-Si region 4a, as well as the presence/absence, size, number, arrangement, etc., of the openings for each TFT, without complicating the manufacturing process. Therefore, it is possible to selectively produce TFTs of different characteristics by the same manufacturing step.

In the example shown in FIG. 1, the semiconductor layer 4 and the contact layers Cs and Cd are provided to extend under the source electrode 8s and the drain electrode 8d. Therefore, it is possible to adjust the area (contact area) of a portion (the c-Si region 4c) of the semiconductor layer 4 that is to be the first region Rs and the second region Rd, without increasing the size of the TFT 101.

While the width of the source electrode 8s and the drain electrode 8d is about the same as the width of the channel region Rc of the semiconductor layer 4 in the channel width direction of the TFT 101 in FIG. 1, it may greater than or smaller than the width of the channel region Rc.

The semiconductor device of the present embodiment is an active matrix substrate having a TFT 101 as a pixel TFT for each pixel, for example. With active matrix substrate, a pixel electrode (not shown) is arranged on the interlayer insulating layer including the inorganic insulating layer 9 for each pixel. The drain electrode 8d of a TFT 101 is electrically connected to the corresponding pixel electrode. The pixel electrode may be in contact with the drain electrode 8d of the TFT 101 in a contact hole (not shown) formed in the interlayer insulating layer. The source electrode 8s of the TFT 101 is electrically connected to the source bus line (not shown), and the gate electrode 2 is electrically connected to the gate bus line (not shown).

An active matrix substrate may have a display region including a plurality of pixels, and a non-display region (referred to also as a peripheral region) other than the display re ion. In the peripheral region, a driving circuit such as a gate driver may be formed monolithically. A driving circuit includes a plurality of TFTs (referred to as "circuit TFTs") circuit TFT may be a crystalline silicon TFT having a similar configuration to that of the TFT 101. Note however that no opening may be provided in the source-drain interval region of some or all of the circuit TFTs. For example, it is preferred that no opening is provided in the source-drain interval region of a circuit TFT that is required to have a large current driving force, such as an output transistor.

<Method for Manufacturing Semiconductor Device>

FIG. 3 to FIG. 9 are schematic step-by-step views illustrating an example of a method for manufacturing a semiconductor device having the TFT 101 (active matrix substrate). In each figure, (a) is a plan view. In each figure, (b) and (c) are cross-sectional views taken respectively along line I-I' and line II-II' shown in FIG. 1. In FIG. 5 to FIG. 9, (d) is a cross-sectional view taken along line III-III' shown in FIG. 1.

First, shown in FIGS. 3(a) to 3(c), the gate electrode 2, the gate insulating layer 3, and a semiconductor film 4' to be the active layer of the TFT are formed in this order on the substrate 1.

A substrate having an insulative surface, such as a glass substrate, a silicon substrate or a heat-resistant plastic substrate (resin substrate), for example, may be used as the substrate 1.

The gate electrode 2 is formed by forming a gate conductive film on the substrate 1 and patterning the gate conductive film. Herein, a gate conductive film (thickness: about 500 nm, for example) is formed on the substrate 1 by a sputtering method, for example, and the metal film patterned by using a known photolithography process. For example, wet etching is used for etching the gate conductive film.

The material of the gate electrode 2 may be a single metal such as molybdenum (Mo), tungsten (W), copper (Cu), chromium (Cr), tantalum (Ta), aluminum (Al) and titanium (Ti), a material obtained by mixing nitrogen, oxygen or another metal therewith, or a transparent conductive material such as indium tin oxide (ITO).

The gate insulating layer 3 is formed by a plasma CVD method, for example, on the substrate 1 with the gate electrode 2 formed thereon. For example, a silicon oxide ($SiO_2$) layer, a silicon nitride (SiNx) layer, or a layered film of an $SiO_2$ layer and an SiNx layer may be formed as the gate insulating layer (thickness: about 0.4 µm, for example) 3.

The semiconductor film 4' can be formed as follows. First, it can be formed by a CVD method using the same deposition chamber as the gate insulating layer 3. Herein, as the semiconductor film 4', an a-Si:H film having a thickness of 30 nm or more and 70 nm or less, for example, is formed by using a hydrogen gas ($H_2$) and a silane gas ($SiH_4$). Thereafter, dehydrogenation annealing (e.g., 450° C., 60 min) is performed for the semiconductor film 4'. Next, a cleaning process (pre-laser cleaning) such as ozone cleaning or HF cleaning may be performed. Then, the semiconductor film 4' is irradiated with laser light 30, thereby crystallizing at least a portion of a semiconductor layer formation region of the semiconductor film 4' that is to be the semiconductor layer of the TFT (partial laser annealing). Herein, only a portion of the semiconductor layer formation region is crystallized. Solid state laser whose wavelength is 550 nm or less, e.g., ultraviolet laser such as XeCl excimer laser (wavelength: 308 nm) or the second harmonic of YAG laser (wavelength: 532 nm) may be used as the laser light 30.

In the present embodiment, the semiconductor film 4' on the substrate 1 is irradiated with the laser light 30 from a laser light source through a microlens array. The microlens array includes a two-dimensional or one-dimensional array of microlenses. When forming a plurality of TFTs on the substrate 1, the laser light 30 is converged by the microlens array to be incident only upon a plurality of predetermined regions (irradiated regions) of the semiconductor film 4' that are spaced apart from each other. Each irradiated region is arranged so as to correspond to a portion to be the channel region of a TFT. The position, number, shape, size, etc., of the irradiated regions can be controlled by the size of the microlens array (which is not limited to a lens that is less than 1 mm), the arrangement pitch thereof, the position of the opening in the mask to be arranged on the light source side of the microlens array. Thus, the region of the semiconductor film 4' that is irradiated with the laser light 30 is heated to be melted and solidified, and becomes the c-Si region 4c. The region that is not irradiated with the laser light remains as the a-Si region 4a.

For the more specific method for partial laser annealing and the configuration of the apparatus used for partial laser annealing (including the structure of a microlens array and mask), the entire disclosures of International Publication WO2011/055618, International Publication WO2011/132559 (Patent Document No. International Publication WO2016/157351 (Patent Document No. 2) and International Publication WO2016/170571 (Patent Document No. 3) are herein incorporated by reference.

Figure 4:
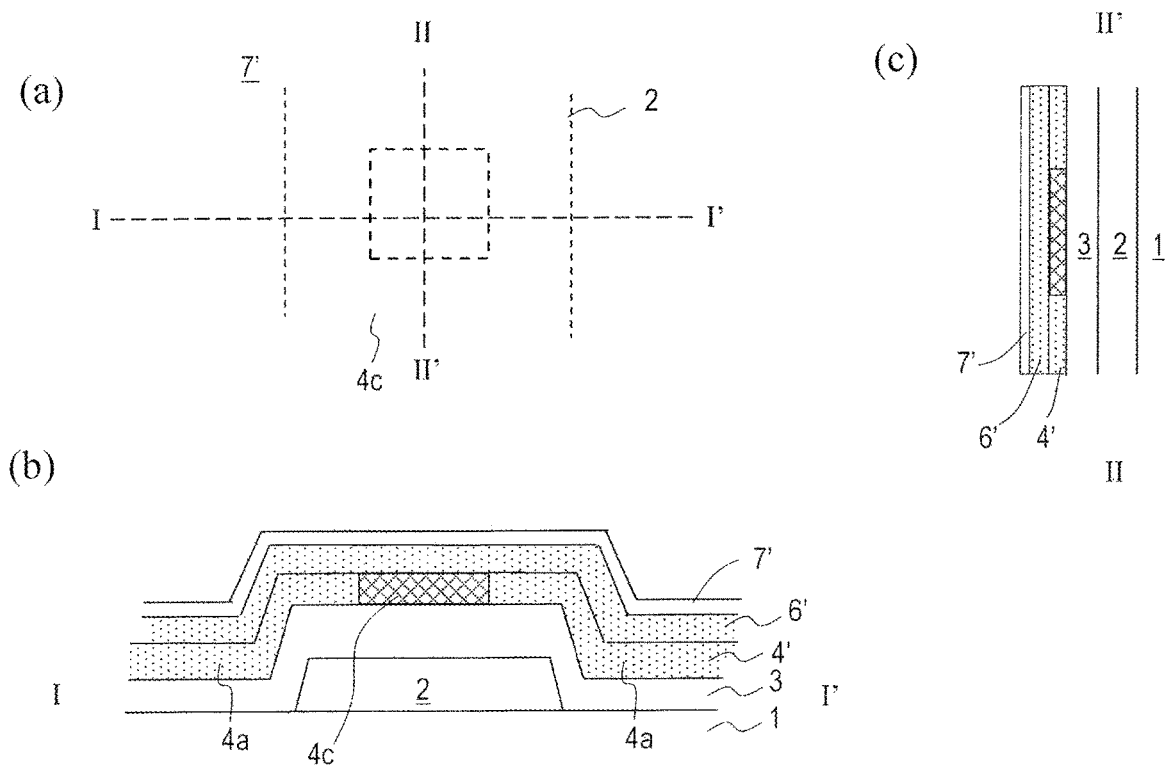
FIGS. 4(a) to 4(c) are a schematic step-by-step plan view and schematic step-by-step cross-sectional views illustrating an example of a method for manufacturing a semiconductor device according to one embodiment of the present invention.

Next, as shown in FIGS. 4(*a*) to 4(*c*), a contact layer Si film is formed on the semiconductor film 4'. Herein, an intrinsic first a-Si film (thickness: about 0.1 μm, for example) 6' and an n+-type second a-Si film (thickness: about 0.05 μm, for example) 7' including an n-type impurity (e.g., phosphorus (F)) are deposited in this order by a plasma CVD method. A hydrogen gas and a silane gas are used as the material gas of the first a-Si film 6'. A mixed gas of silane, hydrogen and phosphine ($PH_3$) is used as the material gas of the second a-Si film 7'.

Figure 5:
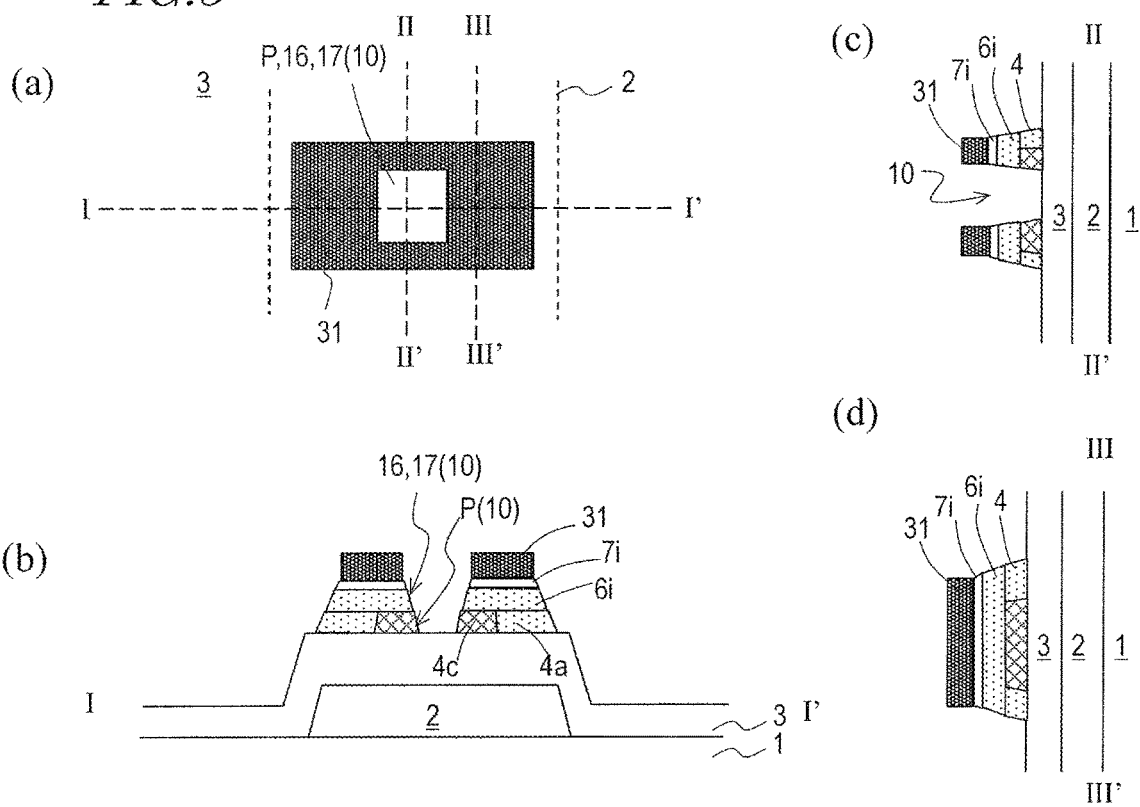
FIGS. 5(a) to 5(d) are a schematic step-by-step plan view and schematic step-by-step cross-sectional views illustrating an example of a method for manufacturing a semiconductor device according to one embodiment of the present invention.

Then, as shown in FIGS. 5(*a*) to 5(*d*), a first resist mask 31 is formed on the second a-Si film 7', and the semiconductor film 4' and a contact layer Si film (herein, the first a-Si film 6' and the second a-Si film 7') are patterned by dry etching, for example, using the first resist mask 31. Thus, there is obtained an island-like laminate composed of the semiconductor layer 4 and an Si layer (an a-Si layer 6i and an a-Si layer 7i). The laminate has the opening 10 that runs through the semiconductor layer 4 and the Si layer and exposes the gate insulating layer 3. The opening 10 is composed of the opening P formed in the semiconductor layer 4 and the opening formed in the layer. Herein, the opening formed in the Si layer includes the first opening 16 formed in the a-Si layer 6i and a second opening 17 formed in the a-Si layer 7i. Although not shown in the figure, when patterning, a surface portion of the gate insulating layer 3 may possibly be etched (overetched). Thereafter, the first resist mask 31 is peeled off the substrate 1.

The semiconductor layer 4 only needs to include at least the c-Si region 4c. In this example, it includes the c-Si region 4c and the a-Si region 4a. The opening P is formed in the c-Si region 4c, for example.

While one opening 10 is formed in one TFT formation region in this example, two or more openings 10 may be formed. Alternatively, one or more notches may be formed instead of, or in addition to, the opening 10. For example, a "notch" includes a depressed portion arranged on the periphery of the semiconductor layer 4 as seen from the direction normal to the substrate 1.

Figure 6:
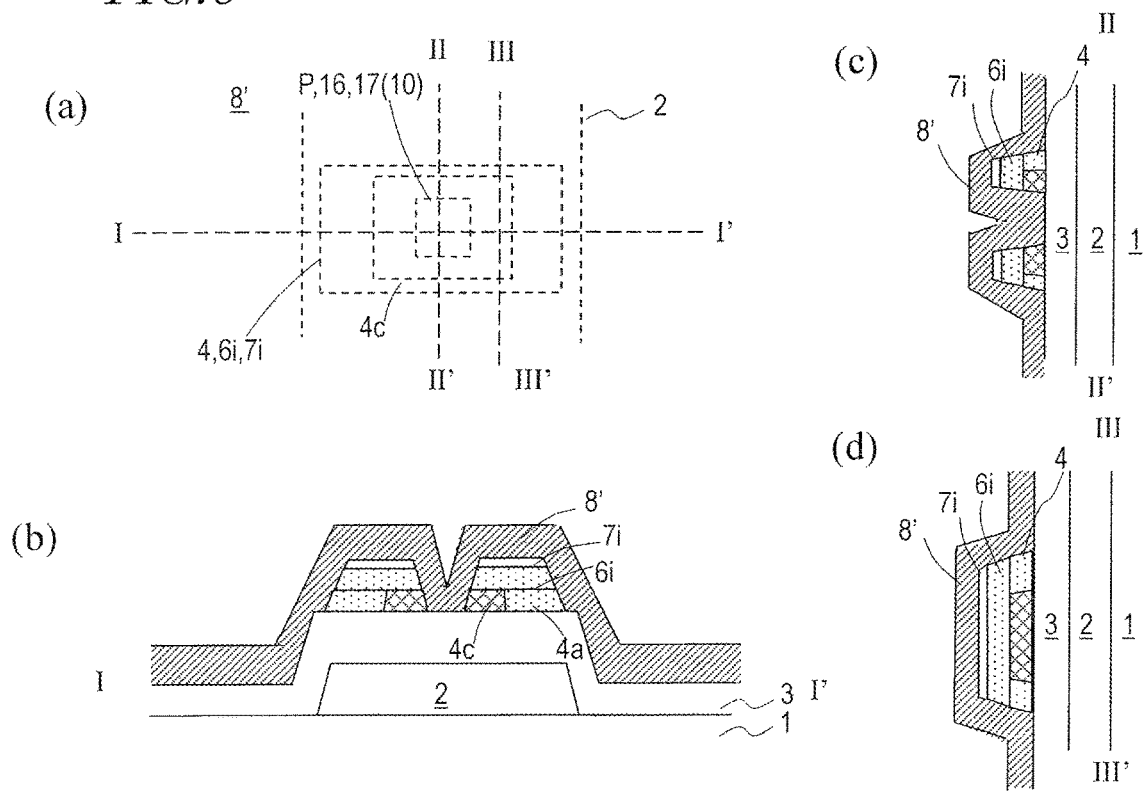
FIGS. 6(a) to 6(d) are a schematic step-by-step plan view and schematic step-by-step cross-sectional views illustrating an example of a method for manufacturing a semiconductor device according to one embodiment of the present invention.
Figure 9:
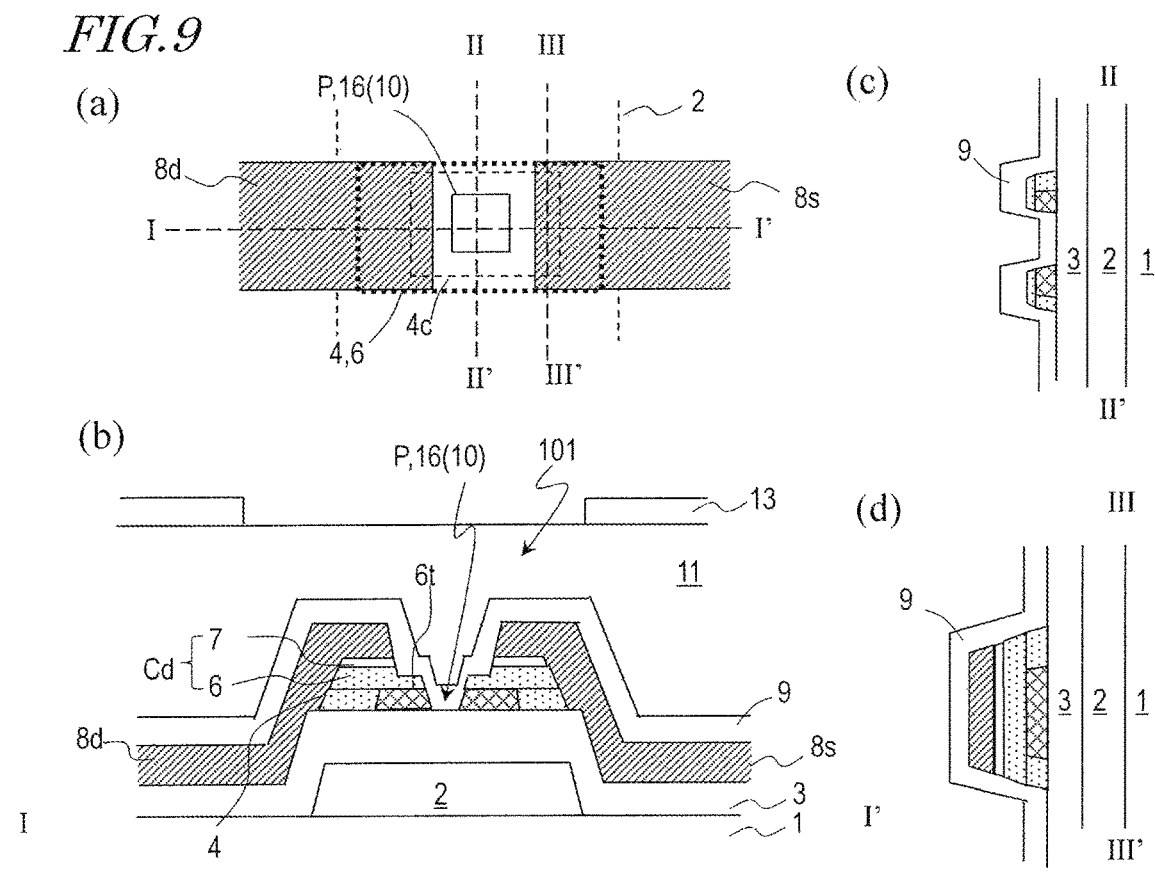
FIGS. 9(a) to 9(d) are a schematic step-by-step plan view and schematic step-by-step cross-sectional views illustrating an example of a method for manufacturing a semiconductor device according to one embodiment of the present invention.

Next, as shown in FIGS. 6(*a*) to 6(*d*), a source and drain electrode conductive film 8' is formed on the laminate, which is composed of the semiconductor layer 4, the a-Si layer 6i and the a-Si layer 7i, and in the opening 10 or a notch. The source and drain electrode conductive film (thickness: about 0.3 μm, for example) 8' can be formed by a method similar to the gate conductive film using a material similar to the gate conductive film.

Thereafter, as shown in FIGS. 7(*a*) to 7(*d*), a second resist mask 32 is formed on the conductive film 8', and the conductive film 8' is patterned using this as a mask. The patterning of the conductive film 8' can be performed by using a wet etching method, for example. A solution containing phosphoric acid, nitric acid and acetic acid may be used as the etchant. This reduces the thickness of a portion of the conductive film 8' that is not covered by the second resist mask 32. Note that through this etching, a portion of the conductive film 8' that is not covered by the second resist mask 32 may be removed.

Then, as shown in FIGS. 8(*a*) to 8(*d*), the conductive film 8' and the a-Si layers 6i and 7i are patterned using the second resist mask 32 as a mask. Herein, dry etching using a chlorine ($Cl_2$) gas, for example, is performed. Thus, a thinned portion of the conductive film 8' is removed, thereby obtaining the source electrode 8s and the drain electrode 8d (source-drain separation step). As seen from the direction normal to the substrate 1, the source electrode 8s and the drain electrode 8d are arranged with an interval therebetween so that the opening P or a notch is located between the source electrode 8s and the drain electrode 8d. The first contact layer Cs and the second contact layer Cd including the first a-Si layer 6 and the second a-Si layer 7 are obtained from the a-Si layers 6i and 7i.

In this example, a portion of the a-Si layer 7i that is not covered by the second resist mask 32 is removed. Therefore, the second a-Si layer 7 is divided into a portion to be the first contact layer Cs and a portion to be the second contact layer Cd. On the other hand, while a surface portion (upper portion) of the a-Si layer 6i is removed, a bottom portion (lower portion) thereof is not removed but remains on the semiconductor layer 4. The periphery of the obtained first a-Si layer 6 is aligned with the periphery of the semiconductor layer 4 as seen from the direction normal to the substrate 1. The portion (portion located on the channel region Rc) 6t of the first a-Si layer 6 that is not covered by the second a-Si layer 7 is thinner than the portion thereof that is covered by the second a-Si layer 7. Although there is no particular limitation on the thickness of the thin portion (thinned portion) 6t of the first a-Si layer 6, it is 30 nm or more and 150 nm or less, for example. If 30 nm or more, it is possible to reduce the damage on the semiconductor layer 4 from the source-drain separation step. If 150 nm or less, it is possible to suppress deterioration in characteristic due to source-drain conduction.

With this patterning step, as seen from the direction normal to the substrate 1, edge portions of the second a-Si layer 7 on the channel region side are aligned with the edge portions of the source electrode 8s or the drain electrode 8d, and edge portions thereof on the side opposite to the channel region are aligned with the semiconductor layer 4 and the first a-Si layer 6.

Thereafter, the second resist mask 32 is removed. Thus, the TFT 101 is manufactured.

Note that in this step, a portion of the a-Si layer 6i that is not covered by the second resist mask 32 may be removed so as to also divide the first a-Si layer 6 into a portion to be the first contact layer Cs and a portion to be the second contact layer Cd (see FIG. 2). In this case, the surface of a portion of the semiconductor layer 4 that is not covered by the second resist mask 32 may possibly be etched (over-etched).

Then, as shown in FIGS. 9(a) to 9(d), an interlayer insulating layer is formed so as to cover the TFT 101. Herein, the inorganic insulating layer 9 and an organic insulating layer 11 are formed as the interlayer insulating layer. A pixel electrode 13 is provided on the organic insulating layer 11.

A silicon oxide layer, a silicon nitride layer, or the like, may be used as the inorganic insulating layer 9. Herein, for example, an SiNx layer (thickness: about 200 nm, for example) is formed by a CVD method as the inorganic insulating layer 9. The inorganic insulating layer 9 is in contact with the gate insulating layer in the opening P.

For example, the organic insulating layer 11 may be an organic insulating film (thickness: 1 to 3 µm, for example) including a photosensitive resin material. Thereafter, the organic insulating layer 11 is patterned to form an opening (not shown). Then, the inorganic insulating layer 9 is etched (dry etched) using the organic insulating layer 11 as a mask. Thus, contact hole (not shown) reaching the drain electrode 8d is formed in the inorganic insulating layer 9 and the organic insulating layer 11.

The pixel electrode 13 is formed as follows. First, a transparent conductive film is formed on the organic insulating layer 11 and in the contact hole. A metal oxide such as indium-tin oxide (ITO), indium-zinc oxide or ZnO can be used as the material of the transparent electrode film. Herein, for example, an indium-zinc oxide film (thickness: about 100 nm, for example) is formed by a sputtering method as the transparent conductive film. Thereafter, the transparent conductive film is patterned by wet etching, for example, to obtain pixel electrodes 13. The pixel electrodes 13 are arranged spaced apart from each other corresponding to pixels. Each pixel electrode 13 is in contact with the drain electrode 8d of the corresponding TFT in the contact hole. Thus, an active matrix substrate is manufactured.

The method for manufacturing an active matrix substrate of the present embodiment is not limited to the method described above. For example, in the step shown in FIG. 5, only the opening 10 may be formed without patterning the semiconductor film 4', the first a-Si film 6' and the second a-Si film 7' into an island-like pattern. Then, as seen from the direction normal to the substrate 1, the semiconductor layer 4, the first a-Si layer 6 and the second a-Si layer 7 may be provided to extend into a region other than the region where the TFT 101 is formed (TFT formation region). For example, the semiconductor layer 4 may extend so as to overlap with a source bus line that is connected to the source electrode 8s. Only a portion of the semiconductor layer 4 that is located in the TFT formation region needs to include the c-Si region 4c, and a portion that is provided to extend into a region other than the TFT formation region may be the a-Si region 4a.

Note that the method for crystallizing the semiconductor film is not limited to the partial laser annealing described above. A part or whole of the semiconductor film may be crystallized using any other method known in the art.

<Variations>

Figure 10:
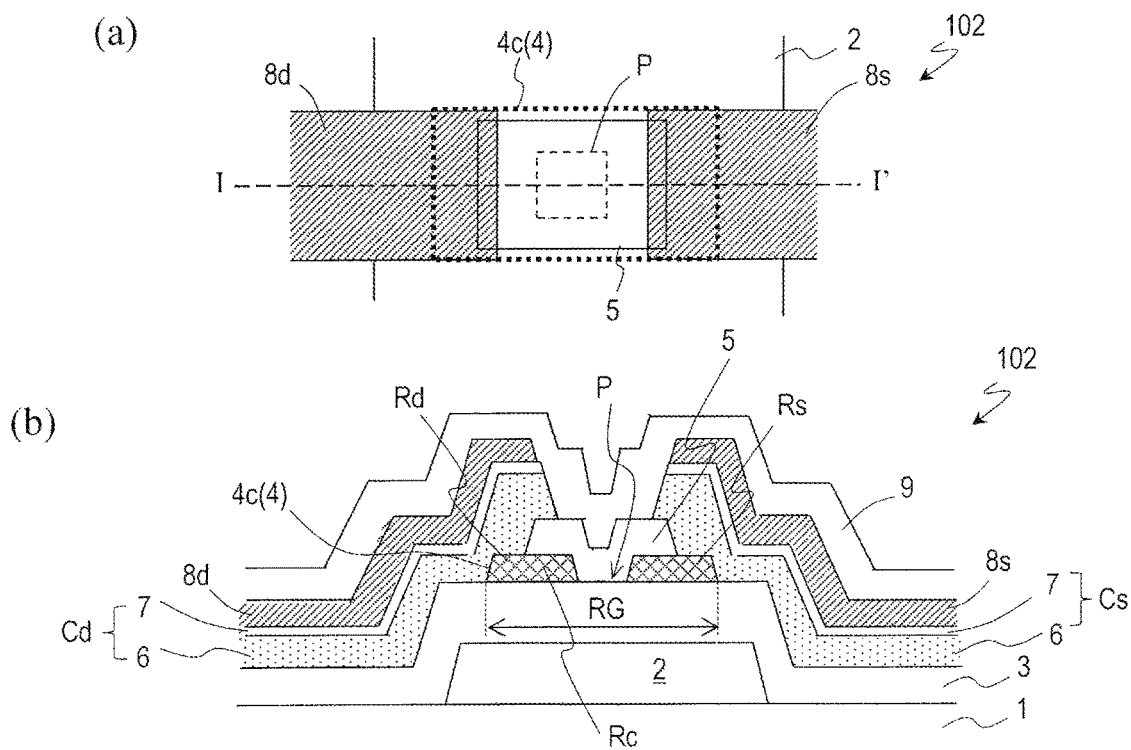
FIGS. 10(a) and 10(b) are a plan view and a cross-sectional view illustrating a TFT 102 according to a variation of one embodiment of the present invention.

FIGS. 10(a) and 10(b) are a plan view and a cross-sectional view illustrating a TFT 102 according to a variation. In FIG. 10, like elements to those of the TFT 101 shown in FIG. 1 are denoted by the same reference signs.

The TFT 102 of the variation is an etch stop-type TFT. The TFT 102 includes a protection layer (etch stop layer) 5 formed on the semiconductor layer 4 having the opening P. The protection layer 5 is arranged on a portion of the semiconductor layer 4 and in the opening P of the semiconductor layer 4. The protection layer 5 covers at least a portion of the channel region Rc of the semiconductor layer 4, and is in contact with the gate insulating layer 3 in the opening P. The first contact layer Cs and the second contact layer Cd are respectively in contact with portions of the semiconductor layer 4 that are not covered by the protection layer 5 (the first region Rs and the second region Rd).

In this example, the protection layer 5 is formed in an island-like pattern. Note that the protection layer 5 does not need to have an island-like pattern. In such a case, the protection layer 5 may have an opening that exposes portions of the semiconductor layer 4 that are to be the first region Rs and the second region Rd.

End portions of the first contact layer Cs, the second contact layer Cd, the source electrode 8s and the drain electrode 8d on the channel region Rc side may be located over the protection layer 5. That is, the protection layer 5 is arranged between the semiconductor layer 4 and the first contact layer Cs and the second contact layer Cd. Note that the first contact layer Cs and the second contact layer Cd each only need to be in contact with the first region Rs and the second region Rd of the semiconductor layer 4 and do not need to be in contact with the protection layer 5.

Figure 14:
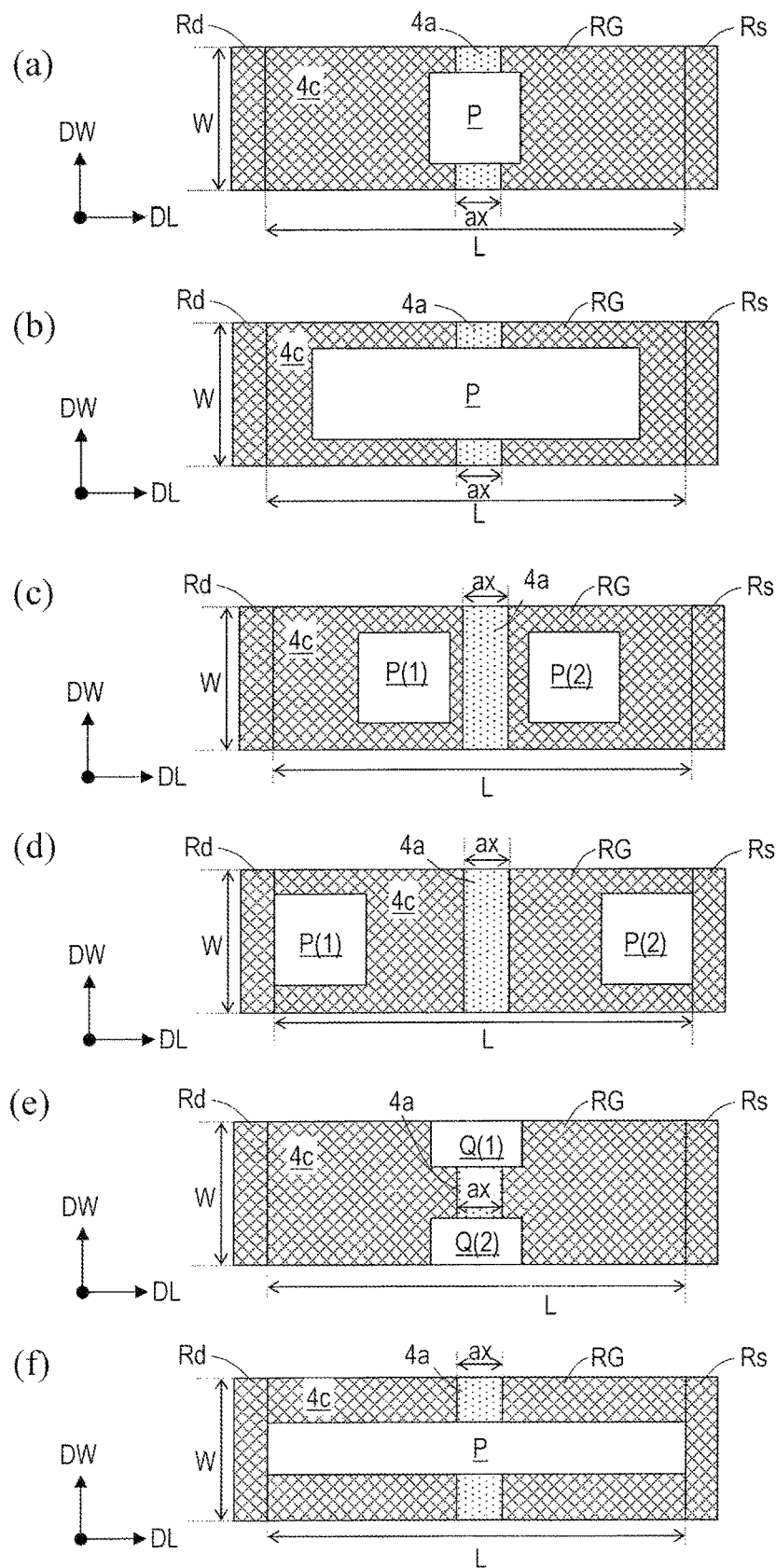
FIGS. 14(a) to 14(f) are schematic plan views showing Arrangement Examples 7 to 12, respectively, of openings P or notches Q and an a-Si region 4a in the source-drain interval region.
Figure 15:
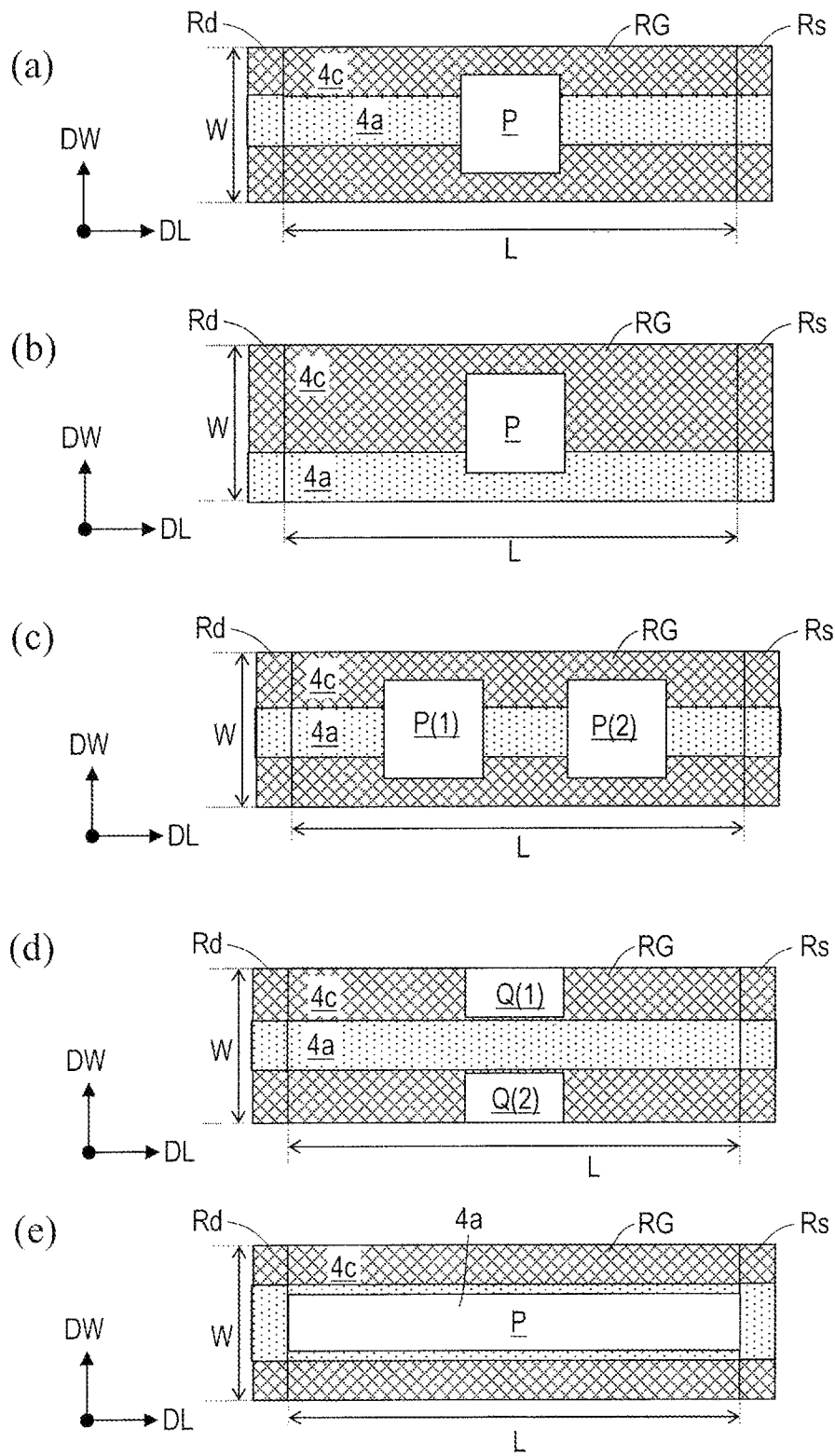
FIGS. 15(a) to 15(e) are schematic plan views illustrating other arrangement examples of openings P or notches Q and the a-Si region 4a in the source-drain interval region.

Also with the TFT 102, as with the TFT 101, the semiconductor layer 4 may include both of the c-Si region 4c and the a-Si region 4a (see FIG. 14 and FIG. 15 to be described below). While the source-drain interval region RG is composed only of the c-Si region 4c in the illustrated example, it may include both of the c-Si region 4c and the a-Si region 4a.

It is preferred that the first region Rs and the second region Rd of the semiconductor layer 4 each include the c-Si region 4c. The first region Rs and the second region Rd may each be composed only of the c-Si region 4c or may include both of the c-Si region 4c and the a-Si region 4a.

Otherwise, the structure is similar to that of the TFT 101, and will not be described below.

According to this variation, since the semiconductor layer 4 has the opening P in the source-drain interval region RG, thereby inhibiting the current flow, and it is possible to reduce the OFF leak current. Since the protection layer 5 is provided in the opening P and on the channel region Rc, it is possible to suppress the damage on the channel region Rc from the source-drain separation step, or the like.

FIGS. 11(a) to 11(d) are step-by-step cross-sectional views illustrating an example of a method for manufacturing the TFT 102. Only what is different from the method for manufacturing the TFT 101 will be described below.

Figure 11:
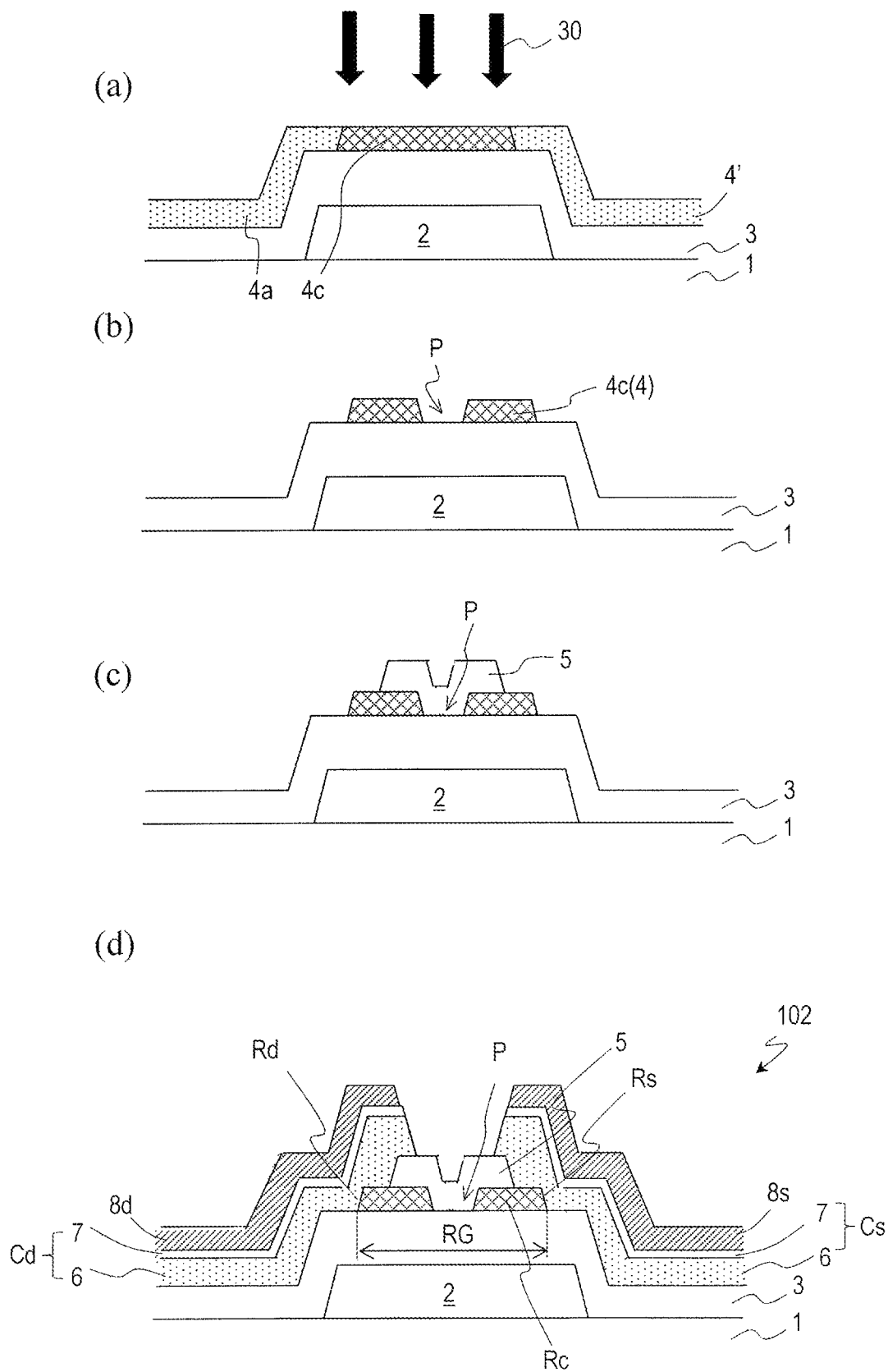
FIGS. 11(a) to 11(d) are schematic cross-sectional views illustrating an example of a method for manufacturing the TFT 102.
Figure 13:
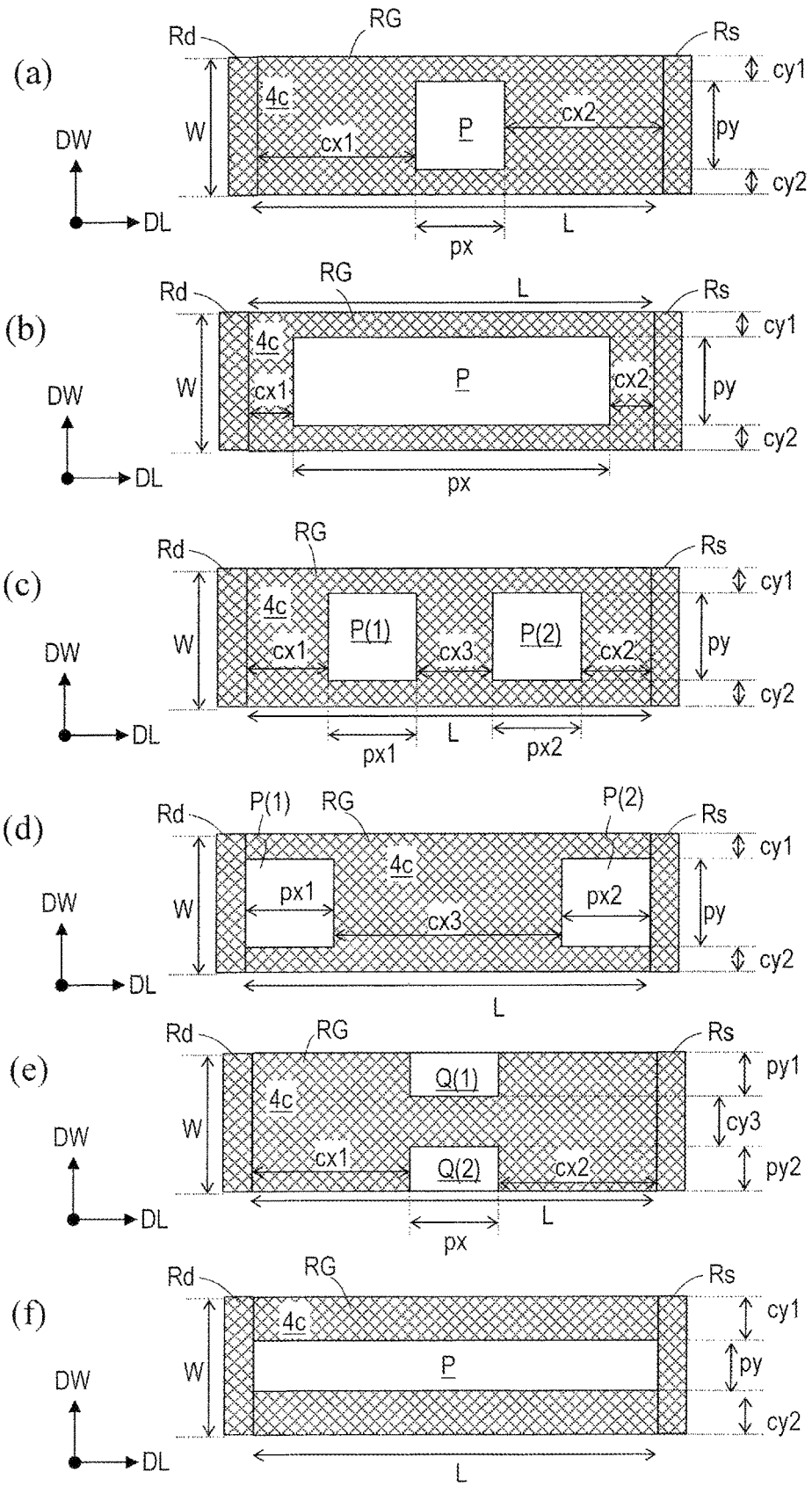
FIGS. 13(a) to 13(f) are schematic plan views showing Arrangement Examples 1 to 6, respectively, of openings P or notches Q in the source-drain interval region.

First, as shown in FIG. 11(a), the gate electrode 2, the gate insulating layer 3 and the semiconductor film 4' are formed on the substrate 1. Next, at least a portion of a semiconductor layer formation region of the semiconductor film 4' that is to be the semiconductor layer of the TFT is irradiated with the laser light 30 (partial laser annealing) from above the semiconductor film 4'. In this example, the entire semiconductor layer formation region is irradiated with the laser light 30 to be crystallized. Thus, the semiconductor film 4' including the c-Si region 4c and the a-Si region 4a is obtained.

Next, as shown in FIG. 11(b), the semiconductor film 4' is patterned by dry etching, for example, using a resist mask (not shown). Thus, there is obtained an island-like semiconductor layer 4 having the opening P that exposes the gate insulating film 3. Note that only the opening P may be formed without patterning it into an island-like pattern.

Next, as shown in FIG. 11(c), the protection layer is formed on the semiconductor layer 4. The protection layer 5 is obtained by forming a protection film on the semiconductor layer 4 and in the opening P, and patterning the protection film using a resist mask (not shown). Herein, as the protection film, an $SiO_2$ film is formed by a CVD method, for example. The thickness of the protection film may be 30 nm or more and 300 nm or less, preferably 50 nm or more and 200 nm or less, for example. The patterning of the protection film is performed by dry etching, for example.

Then, a contact layer silicon film and a source and drain electrode conduct film are formed in this order, and these films are patterned using a resist mask (not shown). As with the method for manufacturing the TFT 101, after a portion of the conductive film is thinned by wet etching, dry etching may be performed so as to remove the thinned portion of the conductive film and the silicon film. Thus, as shown in FIG. 11(d), the first contact layer Cs, the second contact layer Cd, the source electrode 8s and the drain electrode 8d are obtained. Thus, the TFT 102 is manufactured. Thereafter, an inorganic insulating layer may be formed so as to cover the TFT 102.

<Arrangement and Area Percentage of c-Si Region 4c, Opening P and a-Si Region 4a in Source-Drain Interval Region RG>

Next, the arrangement of the c-Si region 4c, the opening P and the a-Si region 4a in the source-drain interval region RG for the TFTs 101 and 102 of the present embodiment will be described in detail.

With the area of the source-drain interval region RG being equal, the OFF leak current of a TFT can be reduced by decreasing the percentage of the area of the c-Si region 4c with respect to the source-drain interval region RG (hereinafter, "c-Si area percentage") Sc, for example. The c-Si area percentage Sc can be decreased by decreasing the percentage of the area of the laser light irradiated region with respect to the source-drain interval region RG, for example. The c-Si area percentage Sc can be decreased also by providing an opening in the c-Si region 4c formed by laser irradiation.

For example, the c-Si area percentage Sc may be 50% or more and 95% or less, preferably 70% or more and 90% or less, for example. If 95% or less, it is possible to more effectively reduce the OFF leak current. On the other hand, if 50% or more, it is possible to ensure the ON characteristic.

The percentage (hereinafter, "opening area percentage") Sp of the area of the opening P or a notch (or the total area where a plurality of openings P or notches are arranged) with respect to the source-drain interval region RG may be 5% or more and 40% or less, preferably 5% or more and 25% or less, for example.

Even for the same c-Si area percentage Sc or the same opening area percentage Sp, it is possible to more effectively inhibit the current flow and further reduce the OFF leak current by the number and arrangement of openings P or notches, for example. Moreover, if the c-Si region 4c is divided into two or more portions by the a-Si region 4a or the opening P in the source-drain interval region RG, it may be possible to more effectively reduce the OFF leak current.

Next, our study on the relationship between the length of the c-Si region 4c in the channel width direction and the current characteristics of the TFT will be described below.

FIG. 12 (a) is a graph showing the relationship between the length of the c-Si region 4c in the channel width direction with respect to the source-drain interval region RG and the ON current Ion and the OFF current (OFF leak current) Ioff of the TFT. Herein, the width of the laser light irradiated region of the semiconductor film was varied in semiconductor film laser crystallization so as to produce four sample TFTs having different lengths of the c-Si region 4c in channel width direction, and the current characteristics of the sample TFTs were measured. The length of the c-Si region 4c in the channel length direction was constant among the sample TFTs. No opening was provided in the sample TFTs. Therefore, the c-Si area percentage Sc increases as the length of the c-Si region 4c in the channel width direction increases.

It can be seen from FIG. 12(a) that the ON current. Ion and the OFF current Ioff of the TFT decrease as the length of the c-Si region 4c in the channel width direction with respect to the source-drain interval region RG decreases. It is believed that this is because the c-Si area percentage Sc decreased and the effective channel width decreased, making it difficult for the current to flow.

As shown in FIG. 12(a), the OFF current changes at a greater rate than the ON current in response to changing the length of the c-Si region 4c in the channel width direction. For example, when the length of the c-Si region 4c in the channel width direction is increased from 4 μm to 12 μm, the ON current increases by about 3 times but the OFF current increases by about 5 times. As a result, there may possibly be a greater disadvantage due to the increase of the OFF current. Conversely, when the length of the c-Si region 4c in the channel width direction is decreased, i.e., when the c-Si area percentage Sc decreased, the rate of decrease of the OFF current is greater than the rate of decrease of the ON current. Thus, it is possible to effectively reduce the OFF current while suppressing the decrease of the ON current by controlling the length of the c-Si region 4c in the channel width direction or the c-Si area percentage Sc.

While the size of the laser light irradiated region is adjusted in this example, similar effects to FIG. 12(a) can be realized by decreasing the c-Si area percentage Sc and the effective channel width by providing the opening P (or a notch) in the c-Si region 4c after laser crystallization. With the provision of the opening P, the effective channel width decreases by the length of the opening P in the channel width direction in a portion of the source-drain interval region RG (defined by the length of the opening P in the channel length direction). Therefore, it is possible to reduce the OFF leak current by adjusting the size of the opening P. The OFF leak current may be more effectively decreased by providing two or more openings P in the source-drain interval region RG.

The maximum value (hereinafter, "first opening length") of the length of the opening P or a notch (the total area where a plurality of openings P or notches are arranged) in the channel width direction of the source-drain interval region RG may be 30% or more and 70% or less, preferably 30% or more and 50% or less, for example, of the length W of the source-drain interval region RG in the channel width direction. Therefore, it is possible to more effectively reduce the OFF leak current while ensuring a predetermined ON current. Note that where only one opening P is arranged in the channel width direction, the length of the opening P in the channel width direction is the "first opening length". Where two or more openings P are arranged in the channel width direction, the maximum value of the total length of these opening P in the channel width direction is the "first opening length".

The maximum value (hereinafter, "second opening length") of the length (or the total length) of the opening P or a notch in the channel length direction of the source-drain interval region RG may be 20% or more and 100% or less, preferably 20% or more and 50% or less, for example, of the length L in the channel length direction of the source-drain interval region RG. Therefore, it is possible to more effectively reduce the OFF leak current while ensuring a predetermined ON current. Note that where only one opening P is arranged in the channel length direction, the length of the opening P in the channel length direction is the "second opening length". Where two or more openings P are arranged in the channel length direction, the maximum value of the total length of these openings P in the channel length direction is the "second opening length".

The c-Si area percentage Sc may be decreased by arranging the a-Si region 4a in the source-drain interval region RG. The percentage (hereinafter, "a-Si area percentage") Sa of the area of the a-Si region 4a with respect to the source-drain interval region RG may be 2% or more and 20% or less, preferably 5% or more and 10% or less, for example, although it is dependent on the opening area percentage Sp. As an example, the c-Si region 4c may be divided into two or more portions in the channel length direction by arranging the a-Si region 4a along the channel width direction of the semiconductor layer 4. Alternatively, the c-Si region 4c may be divided into two or more portions in the channel width direction by arranging the a-Si region 4a along the channel length direction of the semiconductor layer 4.

FIG. 12(b) is a schematic graph showing the relationship between the length of the a-Si region 4a in the channel length direction where the a-Si region 4a is formed along the channel width direction of the semiconductor layer 4, and the mobility and the ON current of the channel region Rc. No opening is provided in the semiconductor layer 4.

As shown in FIG. 12(b), as the length of the a-Si region 4a in the channel length direction increases, the percentage of the a-Si region 4a in the current path increases, thereby lowering the mobility and making it difficult for the current to flow (the OFF current decreases). The OFF current can be suppressed to be less than or equal to a predetermined value if the length of the a-Si region 4a in the channel length direction is 0.5 μm or more, preferably 1 μm or more, for example. On the other hand, the length of the a-Si region 4a in the channel length direction may be less than or equal to ¼ of the length of the source-drain interval region RG in the channel length direction, for example. In order to more reliably ensure a predetermined mobility, the length of the a-Si region 4a in the channel length direction may be set to 2.5 μm or less, for example. Note that in the present embodiment, the a-Si region 4a of a minute width (for example, 2.5 μm or less) can be arranged in the semiconductor layer 4 so that a predetermined region of the semiconductor layer 4 can be selectively crystallized by partial laser annealing.

Two or more a-Si regions 4a may be arranged spaced apart from each other the source-drain interval region RG so as to divide the c-Si region 4c into three or more portions. The shape of the a-Si region 4a is not limited to a rectangular shape. Detailed description and illustration in the figures are omitted because the details are described in International Publication WO2016/157351, which is herein incorporated by reference.

Taking the process precision of the photolithography process into consideration, it is preferred that the width in the channel width direction (channel width) W of the source-drain interval region RG is 13 μm or more and the width in the channel length direction (channel length) L thereof is 13 μm or more for the TFTs 101 and 102.

Taking the process precision into consideration, the width (design value) of each opening P or notch of the semiconductor layer 4 in the channel length direction and the channel width direction is preferably 4 μm or more. The distance (design value) from the periphery of the source-drain interval region RG to the closest opening P is preferably 4 μm or more, for example.

The length of each laser light irradiated region in the channel width direction is preferably 9 μm or more, for example, taking into consideration the resolution and the positional precision of the exposure machine. Then, even if misalignment occurs, since the c-Si region 4c is arranged with a predetermined width in the semiconductor layer 4, it is possible to connect the first contact layer Cs and the second contact layer Cd to the c-Si region 4c, and it is possible to suppress an increase in the ON resistance of the TFT.

Arrangement examples of openings P or notches Q in the source-drain interval region RG of the semiconductor layer 4 will now be described in greater detail with reference to the drawings.

FIGS. 13(a) to 13(f) are plan views showing Arrangement Examples 1 to 6, respectively, of openings P or notches Q for the TFTs 101 and 102 of the present embodiment. FIG. 13 only shows the source-drain interval region RG, the second region Rd and the first region Rs of the semiconductor layer of the TFT. For the sake of simplicity, layers other than the semiconductor layer, e.g., the contact layer and the protection layer, are not shown.

In Arrangement Examples 1 to 6, the source-drain interval region RG, the second region Rd and the first region Rs include no a-Si region but are composed only of the c-Si region 4c. In any of these examples, the length W of the source-drain interval region RG in the channel width direction DW is 13 μm, and the length L thereof in the channel length direction DL is 22 μm.

Although an example where the source-drain interval region RG has a rectangular shape that is elongated in the channel length direction DL is shown herein, the source-drain interval region RG may be elongated in the channel width direction. DW or may be not rectangular. Similarly, although an example where the opening P has a rectangular shape shown, the shape of the opening P does not need to be a rectangular shape.

In Arrangement Example 1 shown in FIG. 13(a), a single opening P is arranged in the source-drain interval region RG. The opening P may be arranged generally at the center of the source-drain interval region RG in the channel length direction DL and in the channel width direction DW. In Arrangement Example 1, the current flowing in the center of the semiconductor layer 4 in the channel length direction DL needs to go around the opening P. Therefore, the current flow is inhibited, thereby decreasing the OFF leak current and the ON current.

As an example, the length py (=first opening length) of the opening P in the channel width direction DW is 5 μm, the length px (=second opening length) thereof in the channel length direction DL is 5 μm, the distance cy1, cy2 from the periphery of the source-drain interval region RG to the opening P in the channel width direction DW is 4 μm, and the distance cx1, cx2 from the periphery of the source-drain interval region RG to the opening P in the channel length direction DL is 8.5 μm.

Note that due to misalignment, etc., in the manufacturing process, the opening P may not be arranged generally at the center. As a result of the alignment between the opening P and the semiconductor layer 4 being shifted in the channel width direction DW, a notch may be formed instead of an opening P, depending on the design value and the amount of misalignment. Also in such a case, it is possible to reduce the OFF leak current and it is possible to realize desired TFT characteristics.

In Arrangement Example 2 shown in FIG. 13(b), as in Arrangement Example 1 shown in FIG. 13(a), there is a single opening P. Note however that the distance cx1, cx2 between the periphery of the source-drain interval region RG and the opening P is set to the minimum value taking the process precision into consideration, the size of the opening P is set to be as larger as possible. In Arrangement Example 2, the effective channel area can be made smaller than in Arrangement Example 1, and it is therefore possible to further reduce the OFF leak current.

As an example, the length py (=first opening length) of the opening P in the channel width direction DW is 5 μm, the length px (=second opening length) thereof in the channel length direction DL is 14 μm, the distance cy1, cy2 from the periphery of the source-drain interval region RG to the opening P in the channel width direction DW is 4 μm, and the distance cx1, cx2 from the periphery of the source-drain interval region RG to the opening P in the channel length direction DL is 4 μm.

Arrangement Examples 3 and 4 shown in FIG. 13(c) and FIG. 13(d) are different from Arrangement Example 1 shown in FIG. 13(a) in that two openings P(1) and P(2) (hereinafter, referred to also collectively as "the openings P") are arranged in the source-drain interval region RG. These openings P are arranged with an interval therebetween in the channel length direction DL. Taking the process precision into consideration, the interval cx3 between the openings P is set to 4 μm or more, for example. By arranging openings P at two or more locations, it is possible to more effectively inhibit the current flow, and it is possible to further reduce the OFF leak current.

In Arrangement Example 3, the interval cx3 between the two openings P is set to the minimum value taking the process precision into consideration. In Arrangement Example 3, as an example, the length py of each opening P in the channel width direction DW is 5 μm, the length px1, px2 thereof in the channel length direction DL is 5 μm, the first opening length (=py) 5 μm, the second opening length (=px1+px2) is 10 μm, the distance cy1, cy2 from the periphery of the source-drain interval region RG to the opening P in the channel width direction DW is 4 μm, the distance cx1, cx2 from the periphery of the source-drain interval region RG to the opening P in the channel length direction DL is 4 μm, and the interval cx3 between the openings P is 4 μm.

In Arrangement Example 4, openings P of the same size are arranged as farthest away as possible from each other. The openings P may be arranged at end portions of the source-drain interval region RG so as to be in contact with the first region Rs or the second region Rd.

In Arrangement Example 4, as an example, the distance cx1, cx2 from the periphery of the source-drain interval region RG to the openings P in the channel length direction DL is 0 μm, and the interval cx3 between the openings P is 12 μm. The other lengths py, px, cy1 and cy2 are equal to those in Arrangement Example 3.

In Arrangement Example 5 shown in FIG. 13(e), two notches Q(1) and Q(2) (hereinafter, referred to also collectively as "the notches Q") are arranged in the source-drain interval region RG. The notches Q are arranged with an interval cy3 therebetween in the channel width direction DW. Taking the process precision into consideration, the interval cy3 between the notches Q is set 4 μm or more, for example. In Arrangement Example 5, the channel region Rc has a narrowed portion that is formed by the notches Q, making it difficult for the current to flow in the channel length direction DL and decreasing the OFF leak current.

As an example, the length py1, py2 of the notches Q in the channel width direction DW is 4.5 μm, the length px thereof in the channel length direction DL is 5 μm, the first opening length (=py1+py2) is 9 μm, the second opening length is 5 μm, the distance cx1, cx2 from the periphery of the source-drain interval region RG to the opening P in the channel length direction DL is 8.5 μm, and the interval cy3 between the notches Q is 4 μm.

In Arrangement Example 6 shown in FIG. 13(f), the opening P is arranged across the length L of the source-drain interval region RG in the channel length direction DL, and the c-Si region 4c is divided into two portions by the opening P in the source-drain interval region RG. That is, there is obtained a structure in which two channel regions having a small channel width are arranged in parallel to each other. These channel regions are connected together by the first region Rs and the second region Rd.

In Arrangement Example 6, for example, the length py (=first opening length) of the opening P in the channel width direction DW as 5 μm, the length px (=second opening length) thereof in the channel length direction DL is 22 μm, the distance cx1, cx2 from the periphery of the source-drain interval region RG to the opening P in the channel length direction DL is 0 μm, and the distance cy1, cy2 from the periphery of the source-drain interval region RG to the opening P in the channel width direction DW is 4 μm.

Table 1 shows the c-Si area percentage Sc, the opening area percentage the percentage of the first opening length with respect to the length W of the source-drain interval region RG in the channel width direction, and the percentage of the second opening length with respect to the length L of the source-drain interval region RG in the channel length direction for Arrangement Examples 1 to 6.

TABLE 1

| Arrangement example | c-Si area percentage Sc | Opening area percentage Sp | a-Si area percentage Sa | First opening length/ length W | Second opening length/ length L |
|---|---|---|---|---|---|
| 1 | 91.3% | 8.7% | — | 0.38 | 0.23 |
| 2 | 75.5% | 24.5% | — | 0.38 | 0.64 |
| 3 | 82.5% | 17.5% | — | 0.38 | 0.45 |
| 4 | 82.5% | 17.5% | — | 0.38 | 0.45 |
| 5 | 84.3% | 15.7% | — | 0.69 | 0.23 |
| 6 | 61.5% | 38.5% | — | 0.38 | 1.0 |
| 7 | 85.7% | 8.7% | 5.6% | 0.38 | 0.23 |
| 8 | 69.9% | 24.5% | 5.6% | 0.38 | 0.64 |
| 9 | 73.4% | 17.5% | 9.1% | 0.38 | 0.45 |
| 10 | 73.4% | 17.5% | 9.1% | 0.38 | 0.45 |
| 11 | 81.5% | 15.7% | 2 8% | 0.69 | 0.23 |
| 12 | 56.0% | 38.5% | 5.6% | 0.38 | 1.0 |

FIGS. 14(a) to 14(f) are plan views illustrating Arrangement Examples 7 to 12, respectively, of openings P or notches Q and the a-Si region 4a of the present embodiment. FIG. 14 only shows the source-drain interval region RG, the second region Rd and the first region Rs of the semiconductor layer of the TFT. In Arrangement Examples 7 to 12, the c-Si region 4c and the a-Si region 4a are provided in the source-drain interval region RG. The arrangements of openings P or notches Q of Arrangement Examples 7 to 12 are similar to Arrangement Examples 1 to 6, respectively, shown in FIG. 13.

In Arrangement Examples 7 to 12, the a-Si region 4a is arranged generally at the center of the source-drain interval region RG so as to extend along the channel width direction DW. Therefore, the c-Si region 4c is divided into two by the a-Si region 4a. Thus, the current flow is more inhibited by arranging the c-Si region 4c discontinuously in the channel length direction DL in the source-drain interval region RG (see FIG. 12(b)). By arranging a combination of the a-Si region 4a and openings P or notches Q in the source-drain interval region RG, it is possible to control the ON current and the OFF current width a higher degree of freedom and in a more strict manner.

As shown in FIGS. 14(a), 14(b), 14(e) and 14(f), the openings P or notches Q may be arranged on a portion of the interface between the c-Si region 4c and the a-Si region 4a. Then, it is possible to arrange the a-Si region 4a in a portion where the effective channel width is narrowed, and it is therefore possible to more effectively inhibit the current flow.

As shown in FIGS. 14(c) and 14(d), the a-Si region 4a may be arranged between two openings P. In these examples, since the opening P is arranged in the c-Si region 4c, it is possible to effectively reduce the c-Si area percentage Sc.

Table 1 also shows the c-Si area percentage Sc and the percentage (hereinafter, "a-Si area percentage") Sa of the area of the a-Si region 4a with respect to the source-drain interval region RG for Arrangement Examples 7 to 12 in a case where the length ax of the a-Si region 4a is 2 μm, for example. The opening area percentage Sp, etc., are the same as those of Arrangement Examples 1 to 6.

Note that the arrangement and the size of the a-Si region 4a are not limited to those of the illustrated example. For example, as illustrated in FIGS. 15(a) to 15(e), the a-Si region 4a may be arranged so as to extend along the channel length direction DL. Then, it is possible to reduce the length of the c-Si region 4c in the channel width direction DW. The c-Si region 4c can be divided by the a-Si region 4a into two or more portions. By arranging the a-Si region 4a so as to extend along the channel length direction DL, it is possible to decrease the effective channel width entirely along the channel length direction DL.

INDUSTRIAL APPLICABILITY

The embodiments of the present invention are widely applicable to devices and electronic appliances including a TFTs. For example, the embodiments of the present invention are applicable to circuit substrates such as active matrix substrates, display devices such as liquid crystal display devices, organic electroluminescence (EL) display devices and inorganic electroluminescence display devices, radiation detectors, imaging devices such as image sensors, electronic devices such as image input devices and fingerprint reader devices, etc.

REFERENCE SIGNS LIST

1: Substrate
2: Gate electrode
3: Gate insulating layer
4: Semiconductor layer
4a: a-Si region
4c: c-Si region
6: First a-Si layer
6t: Thinned portion of first a-Si layer
7: Second a-Si layer
8d: Drain electrode
8s: Source electrode
9: Inorganic insulating layer
101, 102: Thin film transistor
Cs: First contact layer
Cd: Second contact layer
P: Opening
RG: Source-drain interval region
Rc: Channel region
Rs: First region
Rd: Second region

The invention claimed is:

1. A semiconductor device including a thin film transistor, wherein:
   the thin film transistor includes:
      a substrate;
      a gate electrode supported on the substrate;
      a semiconductor layer provided on the gate electrode with a gate insulating layer therebetween, wherein the semiconductor layer includes a first region, a second region, and a source-drain interval region that is located between the first region and the second region and overlaps with the gate electrode as seen from a direction normal to the substrate, the source-drain interval region including a channel region;
      a first contact layer in contact with the first region, and a second contact layer in contact with the second region;
      a source electrode electrically connected to the first region with the first contact layer therebetween; and
      a drain electrode electrically connected to the second region with the second contact layer therebetween;
   the semiconductor layer includes a crystalline silicon region, and at least a portion of the crystalline silicon region is located in the source-drain interval region;
   the semiconductor layer has at least one opening that is located in the source-drain interval region and reaches the gate insulating layer; and
   as seen from a direction normal to the substrate, the at least one opening is located between the source electrode and the drain electrode and does not overlap with either the source electrode or the drain electrode.

2. The semiconductor device according to claim 1, further comprising:
   an insulating layer covering the thin film transistor, wherein the insulating layer is in contact with the gate insulating layer in the at least one opening.

3. The semiconductor device according to claim 2, wherein the insulating layer is in contact with an upper surface of the channel region of the semiconductor layer.

4. The semiconductor device according to claim 1, wherein:
   the first contact layer and the second contact layer each include:
      a first amorphous silicon layer in contact with the semiconductor layer; and
      a second amorphous silicon layer arranged on the first amorphous silicon layer and having a conductivity higher than the first amorphous silicon layer.

5. The semiconductor device according to claim 4, wherein:
   the first amorphous silicon layer is in contact with the channel region, the first region and the second region of the semiconductor layer and has an opening that corresponds to the at least one opening; and a portion of the first amorphous silicon layer that is in contact with the channel region is thinner than a portion thereof that is in contact with the first region and the second region.

6. The semiconductor device according to claim 1, wherein:
the thin film transistor further includes a protection layer that is arranged on a portion of the semiconductor layer and in the at least one opening; and
the protection layer is in contact with at least a portion of an upper surface of the channel region and in contact with the gate insulating layer in the at least one opening.

7. The semiconductor device according to claim 1, wherein the semiconductor layer further includes a non-crystalline silicon region.

8. The semiconductor device according to claim 7, wherein at least a portion of the non-crystalline silicon region is arranged in the source-drain interval region.

9. The semiconductor device according to claim 8, wherein in the source-drain interval region, the crystalline silicon region is divided into two or more by the at least a portion of the non-crystalline silicon region.

10. The semiconductor device according to claim 1, wherein the at least one opening is surrounded by the crystalline silicon region.

11. The semiconductor device according to claim 8, wherein the at least one opening is arranged on a portion of an interface between the crystalline silicon region and the non-crystalline silicon region.

12. The semiconductor device according to claim 8, wherein the at least one opening includes two openings arranged with an interval therebetween in a channel length direction of the thin film transistor, and at least a portion of the non-crystalline silicon region is located between the two openings.

13. The semiconductor device according to claim 1, wherein:
the semiconductor device includes a display region having a plurality of pixels;
the thin film transistor is arranged in each pixel of the display region;
the semiconductor device further includes a driving circuit provided in a region other than the display region;
the driving circuit includes another thin film transistor; and
no opening is provided in a source-drain interval region of the other thin film transistor.

14. A method for manufacturing a semiconductor device including a thin film transistor, the method comprising:
step (A) of preparing a substrate that includes, formed on a surface thereof, a gate electrode and a gate insulating layer covering the gate electrode;
step (B) of forming a semiconductor film made of amorphous silicon on the gate insulating layer;
crystallization step (C) of crystallizing by irradiating, at least a portion of a semiconductor layer formation region of the semiconductor film to be a semiconductor layer with laser light, thereby forming a crystalline silicon region in the portion of the semiconductor layer formation region, where a portion of the semiconductor layer formation region that is not irradiated with laser light becomes a non-crystalline silicon region, wherein at least a portion of the crystalline silicon region is arranged in a portion of the semiconductor layer formation region that is to be a channel region;
step (D) of forming at least one contact layer silicon film on the crystallized semiconductor film;
patterning step (E) of patterning the crystallized semiconductor film and the at least one contact layer silicon film using a first mask so as to form a semiconductor layer and a silicon layer, wherein the semiconductor layer and the silicon layer have an opening or a notch that runs through the semiconductor layer and the silicon layer and exposes the gate insulating layer;
step (F) of forming a source and drain electrode conductive film on the silicon layer; and
step (G) of patterning the source and drain electrode conductive film and the silicon layer using a second mask so as to form a source electrode and a drain electrode separated from each other from the source and drain electrode conductive film and form a first contact layer and a second contact layer from the silicon layer.

15. The method for manufacturing a semiconductor device according to claim 14, wherein:
the at least one contact layer silicon film includes a first amorphous silicon film, and a second amorphous silicon film arranged on the first amorphous silicon film and having a conductivity higher than the first amorphous silicon film; and
in the step (G), as seen from a direction normal to the substrate, a portion of the second amorphous silicon film that does not overlap with the second mask is removed and a portion of the first amorphous silicon film that does not overlap with the second mask is thinned and remains on the semiconductor layer.

16. A method for manufacturing a semiconductor device including a thin film transistor, the method comprising:
step (A) of preparing a substrate that includes, formed on a surface thereof, a gate electrode and a gate insulating layer covering the gate electrode;
step (B) of forming a semiconductor film made of amorphous silicon on the gate insulating layer;
crystallization step (C) of crystallizing by irradiating at least a portion of a semiconductor layer formation region of the semiconductor film to be a semiconductor layer with laser light, thereby forming a crystalline silicon region in the portion of the semiconductor layer formation region, where a portion of the semiconductor film that is not irradiated with laser light becomes a non-crystalline silicon region, wherein at least a portion of the crystalline silicon region is arranged in a portion of the semiconductor layer formation region that is to be a channel region;
step (D) of patterning the crystallized semiconductor film so as to form a semiconductor layer having an opening that exposes the gate insulating layer;
step (E) of forming a protection layer on a portion of the semiconductor layer and in the opening, wherein the protection layer is in contact with at least a portion of an upper surface of a portion to be the channel region and in contact with the gate insulating layer in the opening;
step (F) of forming a contact layer silicon film and a source and drain electrode conductive film in this order so as to cover the protection layer and the semiconductor layer; and
step (G) of patterning the source and drain electrode conductive film and the contact layer silicon film using a first mask so as to form a source electrode and a drain electrode separated from each other and a first contact layer and a second contact layer separated from each other.

17. The semiconductor device according to claim 1, wherein the at least one opening includes a plurality of openings arranged with an interval therebetween in a channel length direction of the thin film transistor.

18. The semiconductor device according to claim 1, wherein the at least one opening is one single opening.

19. The semiconductor device according to claim 1, wherein no opening is provided in the first region and the second region of the semiconductor layer.

* * * * *